United States Patent
Han et al.

(10) Patent No.: US 11,672,146 B2
(45) Date of Patent: Jun. 6, 2023

(54) DISPLAY DEVICE COMPRISES A CONCENTRATION OF FLUORINE PROVIDES FIRST PEAK IN FIRST AREA AND SECOND PEAK IN THIRD AREA CONTAINED IN THE SEMICONDUCTOR LAYER

(71) Applicant: Samsung Display Co., Ltd., Yongin-si (KR)

(72) Inventors: Jae Bum Han, Suwon-si (KR); Moon Sung Kim, Anyang-si (KR); Young Gil Park, Asan-si (KR); Soo Im Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 140 days.

(21) Appl. No.: 17/373,602

(22) Filed: Jul. 12, 2021

(65) Prior Publication Data

US 2022/0028947 A1    Jan. 27, 2022

(30) Foreign Application Priority Data

Jul. 23, 2020  (KR) ........................ 10-2020-0091423

(51) Int. Cl.
*H01L 29/08* (2006.01)
*H01L 27/32* (2006.01)
(Continued)

(52) U.S. Cl.
CPC ........ *H01L 27/3262* (2013.01); *H01L 27/323* (2013.01); *G09G 3/3233* (2013.01);
(Continued)

(58) Field of Classification Search
CPC .............. H01L 27/3262; H01L 27/323; H01L 27/1222; H01L 27/1274; H01L 29/78675; H01L 29/66757
(Continued)

(56) References Cited

U.S. PATENT DOCUMENTS

2010/0289088 A1* 11/2010 Li ................... H01L 21/823807
257/E27.061
2012/0112184 A1   5/2012 Yamazaki et al.
(Continued)

FOREIGN PATENT DOCUMENTS

JP          2015142001 A  *  8/2015
KR   10-2016-0137129         11/2016
(Continued)

*Primary Examiner* — Phuc T Dang
(74) *Attorney, Agent, or Firm* — H.C. Park & Associates, PLC

(57) ABSTRACT

A display device includes: a substrate; and a semiconductor layer disposed on the substrate, and including a first area, a second area, and a third area that are sequentially positioned by dividing the semiconductor layer into three areas in a thickness direction of the semiconductor layer, wherein the semiconductor layer includes polycrystalline silicon, a concentration of fluorine contained in the semiconductor layer has a first peak value in the first area and a second peak value in the third area, and the first peak value of the concentration of the fluorine in the semiconductor layer is about 30% or less of the second peak value of the concentration of the fluorine in the semiconductor layer.

13 Claims, 17 Drawing Sheets

(51) Int. Cl.
   *G09G 3/3233* (2016.01)
   *H01L 29/66* (2006.01)
   *H01L 27/12* (2006.01)
   *H01L 29/786* (2006.01)

(52) U.S. Cl.
   CPC .. *G09G 2300/0426* (2013.01); *H01L 27/1222* (2013.01); *H01L 27/1274* (2013.01); *H01L 29/66757* (2013.01); *H01L 29/78675* (2013.01); *H01L 2227/323* (2013.01)

(58) Field of Classification Search
   USPC ........................................................ 257/40
   See application file for complete search history.

(56) References Cited

U.S. PATENT DOCUMENTS

| | | | |
|---|---|---|---|
| 2018/0145216 A1* | 5/2018 | Lee | H01L 33/46 |
| 2019/0288048 A1* | 9/2019 | Kang | H01L 27/3265 |
| 2019/0326555 A1 | 10/2019 | Yang et al. | |

FOREIGN PATENT DOCUMENTS

| KR | 10-2018-0008954 | 1/2018 |
|---|---|---|
| KR | 10-2019-0123514 | 11/2019 |

* cited by examiner

DISPLAY DEVICE COMPRISES A CONCENTRATION OF FLUORINE PROVIDES FIRST PEAK IN FIRST AREA AND SECOND PEAK IN THIRD AREA CONTAINED IN THE SEMICONDUCTOR LAYER

CROSS-REFERENCE TO RELATED APPLICATION

This application claims priority from and the benefit of Korean Patent Application No. 10-2020-0091423 filed on Jul. 23, 2020 which is hereby incorporated by reference for all purposes as if fully set forth herein

BACKGROUND

Field

Embodiments of the invention relate generally to a display device and, more specifically, to a display device with improved reliability.

Discussion of the Background

A pixel driving circuit of a display device includes a thin film transistor using silicon. As silicon forming the thin film transistor, amorphous silicon or polycrystalline silicon is used.

Recently, the amorphous silicon thin film transistor (TFT) has tended to be replaced by a polycrystalline silicon TFT (poly-Si TFT). The polycrystalline silicon TFT has higher electron mobility and superior stability to light irradiation than the amorphous silicon TFT. Thus, the polycrystalline silicon TFT is suitable for use as an active layer for driving and/or switching thin film transistors in a display device.

Polycrystalline silicon can be manufactured by various methods, which may be largely classified into a method of directly depositing polycrystalline silicon and a method of depositing amorphous silicon and then crystallizing it. In the method of depositing an amorphous silicon thin film and then crystallizing it, the amorphous silicon thin film is crystallized by a laser beam irradiation method or a heating method.

The above information disclosed in this Background section is only for understanding of the background of the inventive concepts, and, therefore, it may contain information that does not constitute prior art.

SUMMARY

Applicant discovered that when a display device is manufactured, out-gassing, which may be occurred due to gasses, causes a stain or film breakage of a semiconductor layer of the display device during a crystallization process of the semiconductor layer such that the quality of the display device may be degraded.

Display devices constructed according to the principles of the invention have improved reliability by minimizing out-gassing in an excimer laser annealing (ELA) process. For example, the out-gassing is minimized in the ELA process, so that the reliability of the display devices may be improved.

Methods of manufacturing the display devices according to the principles of the invention improve the reliability of the display devices by minimizing or preventing out-gassing in various layers of the display devices.

Additional features of the inventive concepts will be set forth in the description which follows, and in part will be apparent from the description, or may be learned by practice of the inventive concepts.

According to an aspect of the invention, a display device includes: a substrate; and a semiconductor layer disposed on the substrate, and including a first area, a second area, and a third area that are sequentially positioned by dividing the semiconductor layer into three areas in a thickness direction of the semiconductor layer, wherein the semiconductor layer includes polycrystalline silicon, a concentration of fluorine contained in the semiconductor layer has a first peak value in the first area and a second peak value in the third area, and the first peak value of the concentration of the fluorine in the semiconductor layer is about 30% or less of the second peak value of the concentration of the fluorine.

The semiconductor layer may further include a low point value as a lowest value of the concentration of the fluorine in the semiconductor layer, and the low point value of the concentration of the fluorine may be substantially equal to or less than the first peak value of the concentration of the fluorine.

The low point value of the concentration of the fluorine may be substantially equal to or less than 1E20 atoms/cm$^3$.

The low point value of the concentration of the fluorine may be in the second area.

The semiconductor layer may further include a first surface facing the substrate and a second surface opposite to the first surface, wherein the first surface may be disposed in the first area, and the second surface is disposed in the third area, and wherein the first peak value is disposed on the first surface, and the second peak value may be disposed on the second surface in the thickness direction.

The display device may further include: a barrier layer disposed on the substrate; and a buffer layer disposed on the barrier layer, and including a first buffer film and a second buffer film sequentially stacked, wherein the barrier layer and the second buffer film may include silicon oxide, and the first buffer film may include silicon nitride.

A film density of the second buffer film may be greater than a film density of the barrier layer.

The film density of the second buffer film may be in a range of about 2.2 g/cm$^3$ to about 2.25 g/cm$^3$.

A concentration of hydrogen of the second buffer film may be lower than a concentration of hydrogen of the barrier layer.

The concentration of hydrogen of the second buffer film may be about 5 at % or less.

The first buffer film may include a third surface facing the barrier layer and a fourth surface opposite to the third surface, a concentration of fluorine contained in the first buffer film may have a third peak value on at least one of the third surface and the fourth surface, and the third peak value of the concentration of the fluorine in the first buffer film may be higher than a concentration of fluorine at a center point of the first buffer film in the thickness direction.

The third peak value of the concentration of the fluorine in the first buffer film may be about 2.5 times or less the concentration of the fluorine at the center point of the first buffer film.

A concentration of carbon contained in the first buffer film may have a fourth peak value on at least one of the third surface and the fourth surface, and the fourth peak value of the concentration of the carbon in the first buffer film may be about 2.5 times or less a concentration of carbon at the center point of the first buffer film.

According to another aspect of the invention, a display device includes: a substrate; a first insulating layer disposed on the substrate and including silicon nitride; a second insulating layer disposed on the first insulating layer and including silicon oxide; and a semiconductor layer disposed on the second insulating layer and including polycrystalline silicon, wherein a film density of the second insulating layer is in a range of about 2.2 g/cm$^3$ to about 2.25 g/cm$^3$.

A concentration of hydrogen of the second insulating layer may be about 5 at % or less.

The display device may further include a barrier layer disposed between the substrate and the first insulating layer and including silicon oxide, wherein a film density of the barrier layer may be less than a film density of the second insulating layer, and a concentration of hydrogen of the barrier layer may be higher than a concentration of hydrogen of the second insulating layer.

According to another aspect of the invention, a display device include: a substrate; a first insulating layer disposed on the substrate and including silicon nitride; a second insulating layer disposed on the first insulating layer and including silicon oxide; and a semiconductor layer disposed on the second insulating layer and including polycrystalline silicon, wherein the first insulating layer includes a first surface facing the substrate and a second surface opposite to the first surface, a concentration of fluorine contained in the first insulating layer has a first peak value on at least one of the first surface and the second surface of the first insulating layer, and the first peak value of the concentration of the fluorine is about 2.5 times or less a concentration of fluorine at a center point of the first insulating layer in a thickness direction.

The first peak value of the concentration of the fluorine in the first insulating layer may be higher than the concentration of the fluorine at the center point of the first insulating layer.

The concentration of the fluorine at the center point of the first insulating layer may be lower than about 1E20 atoms/cm3.

A concentration of carbon contained in the first insulating layer may have a second peak value on at least one of the first surface and the second surface of the first insulating layer, and the second peak value of the concentration of the carbon in the first insulating layer may be 2.5 times or less the concentration of the carbon at the center point of the first insulating layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
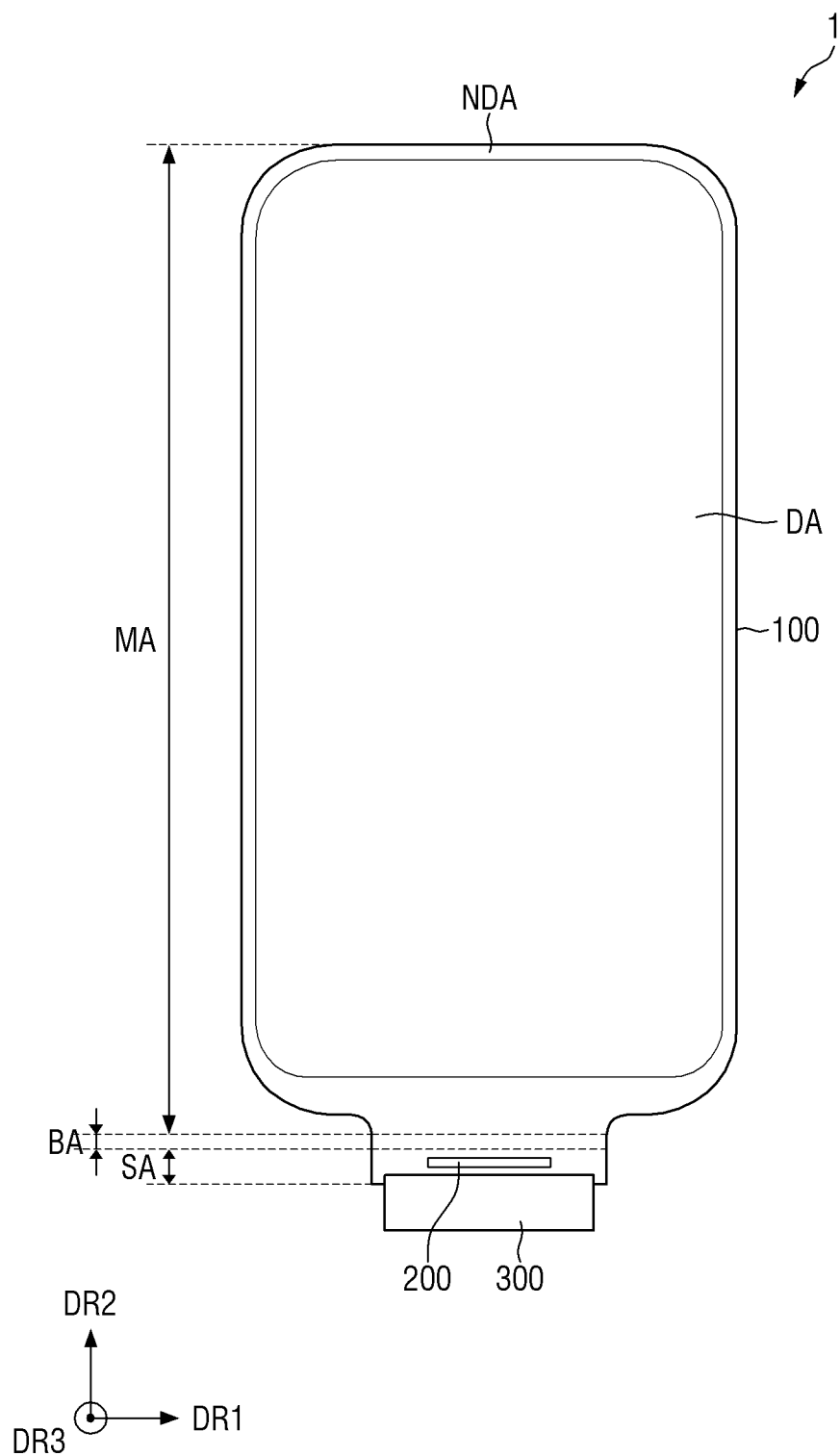
FIG. 1 is a plan view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments will be described in detail with reference to the accompanying drawings.

Figure 2:
FIG. 2 is a side view of the display device of FIG. 1.
Figure 2:
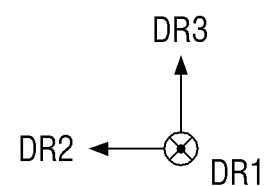

FIG. 1 is a plan view of a display device according to an embodiment. FIG. 2 is a side view of the display device of FIG. 1. FIG. 2 shows a side elevation of the display device bent in a thickness direction.

A display device 1 is a device for displaying a moving image or a still image. The display device 1 may be used as a display screen of various products such as televisions, laptop computers, monitors, billboards and the Internet of Things as well as portable electronic devices such as mobile phones, smart phones, tablet personal computers (tablet PCs), smart watches, watch phones, mobile communication terminals, electronic notebooks, electronic books, portable multimedia players (PMPs), navigation systems and ultra mobile PCs (UMPCs).

The display device 1 according to an embodiment may have a substantially rectangular shape in a plan view. The display device 1 may have a rectangular shape with right-angled corners in a plan view. However, embodiments are not limited thereto. For example, the display device 1 may have a rectangular shape with rounded corners in a plan view.

In the drawings, a first direction DR1 indicates a horizontal direction of the display device 1 in a plan view, and a second direction DR2 indicates a vertical direction of the display device 1 in a plan view. Further, a third direction DR3 indicates a thickness direction of the display device 1. The first direction DR1 and the second direction DR2 perpendicularly intersect each other. The third direction DR3 is a direction intersecting the plane on which the first direction DR1 and the second direction DR2 are located, and perpendicularly intersects both the first direction DR1 and the second direction DR2. It should be understood, however, that a direction mentioned in the embodiment refers to a relative direction and the embodiment is not limited to the direction mentioned.

Unless otherwise defined, with respect to the third direction DR3, the terms "above," "top surface," and "upper side" as used herein refer to a display surface's side of a display panel 100, and the terms "below," "bottom surface," and "lower side" as used herein refer to a side opposite to the display surface of the display panel 100.

Referring to FIGS. 1 and 2, the display device 1 may include a display panel 100. The display panel 100 may be a flexible substrate including a flexible polymer material such as polyimide or the like. Accordingly, the display panel 100 can be twisted, bent, folded or rolled.

The display panel 100 may be an organic light emitting display panel. In the following embodiments, a case where the organic light emitting display panel is used as the display panel 100 will be described as an example, but embodiments are not limited thereto, and other types of display panels such as a liquid crystal display (LCD) panel, a quantum dot organic light emitting display (QD-OLED) panel, a quantum dot liquid crystal display (QD-LCD) panel, a quantum-nano light emitting display (QNED) panel and a micro LED panel may be used as the display panel 100.

The display panel 100 may include a display area DA for displaying a screen and a non-display area NDA where no display is performed. The display panel 100 may be divided into the display area DA and the non-display area NDA in a plan view. The non-display area NDA may be disposed to surround the display area DA. The non-display area NDA may form a bezel.

The display area DA may have a rectangular shape with right-angled or rounded corners in a plan view. However, the planar shape of the display area DA is not limited to a rectangular shape, but may have a circular shape, an elliptical shape, or various other shapes.

The display area DA may include a plurality of pixels. The pixels may be arranged in a matrix. Each pixel may include a light emitting layer and a circuit layer for controlling the amount of light emitted from the light emitting layer. The circuit layer may include a wiring, an electrode, and at least one transistor. The light emitting layer may include an organic light emitting material. The light emitting layer may be encapsulated by an encapsulation layer. A detailed configuration of the pixel will be described later.

The non-display area NDA may surround all sides of the display area DA and form edges of the display area DA. However, embodiments are not limited thereto.

The display panel 100 may include a main region MA, a bending region BA, and a sub-region SA. For example, the bending region BA may be bent in a thickness direction (e.g., in the third direction DR3). Further, one end side of the bending region BA may be connected to one side of the main region MA in the second direction DR2, and another end side of the bending regions BA may be connected to one side of the sub-region SA in the second direction DR2. For example, the sub-region SA may overlap the main region MA in the thickness direction (e.g., in the third direction DR3).

The display area DA may be located in the main region MA. The non-display area NDA may be located in the peripheral edge portion of the display area DA of the main region MA.

The main region MA may have a shape similar to an outer shape of the display device 1 in a plan view. The main region MA may be a flat region located on one plane, but embodiments are not limited thereto. For example, at least one edge of the remaining edges except for an edge (or a side) of the main region MA connected to the bending region BA may be bent in a curved shape or bent in a vertical direction.

When at least one of the edges other than the edge (or side) of the main region MA connected to the bending region BA is curved or bent, the display area DA may also be disposed on the corresponding edge, but embodiments are not limited thereto. For example, the non-display area NDA that does not display a screen may be disposed on the curved or bent edge. Alternatively, both the display area DA and the non-display area NDA may be disposed on the curved or bent edge.

The non-display area NDA of the main region MA may be disposed in an area extending from the outer boundary of the display area DA to the edge of the display panel 100. Signal lines or driving circuits may be disposed in the non-display area NDA of the main region MA to supply a signal to the display area DA.

The bending region BA may be connected through one short side of the main region MA. The width of the bending region BA in the first direction DR1 may be smaller than the width of the main region MA in the first direction DR1 (e.g., the width of the short side of the main region MA). For example, as shown in FIG. 1, a connection portion between the main region MA and the bending region BA may have an L-shaped cut portion to reduce the width of the bezel.

In the bending region BA, the display panel 100 may be bent at a curvature in a direction opposite to the display surface. The surface of the display panel 100 may be reversed as the display panel 100 is bent in the bending region BA. In other words, one surface of the display panel 100 facing upward may be changed to face laterally outward through the bending region BA and then to face downward.

The sub-region SA extends from the bending region BA. The sub-region SA may extend in a direction parallel to the main region MA from one end side of the bending region BA. The sub-region SA may overlap the main region MA in the thickness direction of the display panel 100. The sub-region SA may overlap the non-display area NDA of the edge of the main region MA and further overlap the display area DA of the main region MA. The width of the sub-region SA may be the same as the width of the bending region BA, but embodiments are not limited thereto.

A pad member may be arranged on the sub-region SA of the display panel 100. An external device may be mounted on (or attached to) the pad member. The examples of the external device may include a driving chip 200 and a driving board 300 composed of a flexible or rigid printed circuit board, and a wiring connection film, a connector, or the like may also be mounted on the pad member as an external device. For example, one or more external devices may be mounted on the sub-region SA. For example, as exemplarily shown in FIGS. 1 and 2, the driving chip 200 may be arranged on the sub-region SA of the display panel 100, and the driving board 300 may be attached to one end of the sub-region SA. In this case, the display panel 100 may include a pad member connected to the driving chip 200 and another pad member connected to the driving board 300. In an alternative embodiment, the driving chip 200 may be mounted on a film, which is adhered to the sub-region SA of the display panel 100.

The driving chip 200, which is mounted on one surface of the display panel 100 as the same surface as the display surface, may be mounted on the surface of the display panel 100 facing downward in the thickness direction by the bending region BA. Thus, the driving chip 200 may be reversed such that the top surface of the driving chip 200 faces downward.

The driving chip 200 may be attached onto the display panel 100 through an anisotropic conductive film or through ultrasonic bonding. The driving chip 200 may include an integrated circuit for driving the display panel 100.

Figure 3:
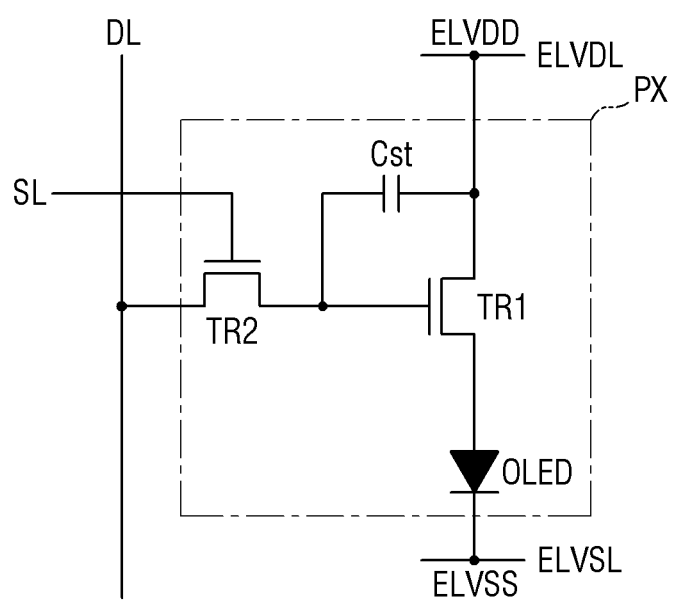
FIG. 3 is an equivalent circuit diagram of a representative pixel of the display device of FIG. 1.

FIG. 3 is an equivalent circuit diagram of one pixel of a display device according to an embodiment.

Referring to FIG. 3, the pixel PX may include a first transistor TR1, a second transistor TR2, a light emitting element OLED and a capacitor Cst. Although FIG. 3 illustrates that each pixel PX has a two-transistor and one-capacitor (2T1C) structure having two transistors TR1 and TR2 and one capacitor Cst. However, embodiments are not limited thereto. Each pixel PX may include a plurality of transistors and a plurality of capacitors. For example, various modified pixel structures such as a three-transistor and one-capacitor (3T1C) structure, a six-transistor and one-capacitor (6T1C) structure, a seven-transistor and one-capacitor (7T1C) structure, and a five-transistor and two-capacitor (5T2C) structure may be applied to each pixel PX.

Each of the first and second transistors TR1 and TR2 may include a first source/drain electrode, a second source/drain electrode and a gate electrode. One of the first source/drain electrode and the second source/drain electrode may be a source electrode, and the other one may be a drain electrode.

Each of the first and second transistors TR1 and TR2 may be formed of a thin film transistor. Further, although FIG. 3 illustrates that each of the first and second transistors TR1 and TR2 is formed of an N-type metal oxide semiconductor field effect transistor (MOSFET). However, embodiments are not limited thereto. Each of the first transistor TR1 and the second transistor TR2 may be formed of a P-type MOSFET. In this case, the positions of the source electrode and the drain electrode of each of the first transistor TR1 and the second transistor TR2 may be changed. In the following description, it is assumed that the first and second transistors TR1 and TR2 are N-type MOSFETs.

The first transistor TR1 may be a driving transistor. Specifically, the gate electrode of the first transistor TR1 is connected to the second source/drain electrode of the second transistor TR2 and the second electrode of the capacitor Cst. The first source/drain electrode of the first transistor TR1 is connected to the first power line ELVDL. The second source/drain electrode of the first transistor TR1 is connected to an anode electrode of the light emitting element OLED. The first transistor TR1 receives a data signal Dj (wherein j is an integer of 1 or more) according to a switching operation of the second transistor TR2 to supply a driving current to the light emitting element OLED.

The gate electrode of the second transistor TR2 is connected to the scan line SL. The first source/drain electrode of the second transistor TR2 is connected to the data line DL. The second source/drain electrode of the second transistor TR2 is connected to the gate electrode of the first transistor TR1 and the second electrode of the capacitor Cst. The second transistor TR2 is turned on according to the scan signal Sk (wherein k is an integer of 1 or more) to perform a switching operation of transmitting the data signal Dj (wherein j is an integer of 1 or more) to the gate electrode of the first transistor TR1.

The first electrode of the capacitor Cst may be connected to the first power line ELVDL and the first source/drain electrode of the first transistor TR1, and the second electrode of the capacitor Cst may be connected to the gate electrode of the first transistor TR1 and the second source/drain electrode of the second transistor TR2. The capacitor Cst may maintain or store the data voltage applied to the gate electrode of the first transistor TR1.

The light emitting element OLED may emit light according to the driving current of the first transistor TR1. The light emitting element OLED may be an organic light emitting diode including an anode electrode, an organic light emitting layer and a cathode electrode (e.g., a second electrode). The anode electrode of the light emitting element OLED may be connected to the second source/drain electrode of the first transistor TR1, and the cathode electrode of the light emitting element OLED may be connected to the second power line ELVSL to which the second source voltage ELVSS lower than the first source voltage ELVDD is applied.

Hereinafter, the cross-sectional structure of the pixel PX will be described in detail.

Figure 4:
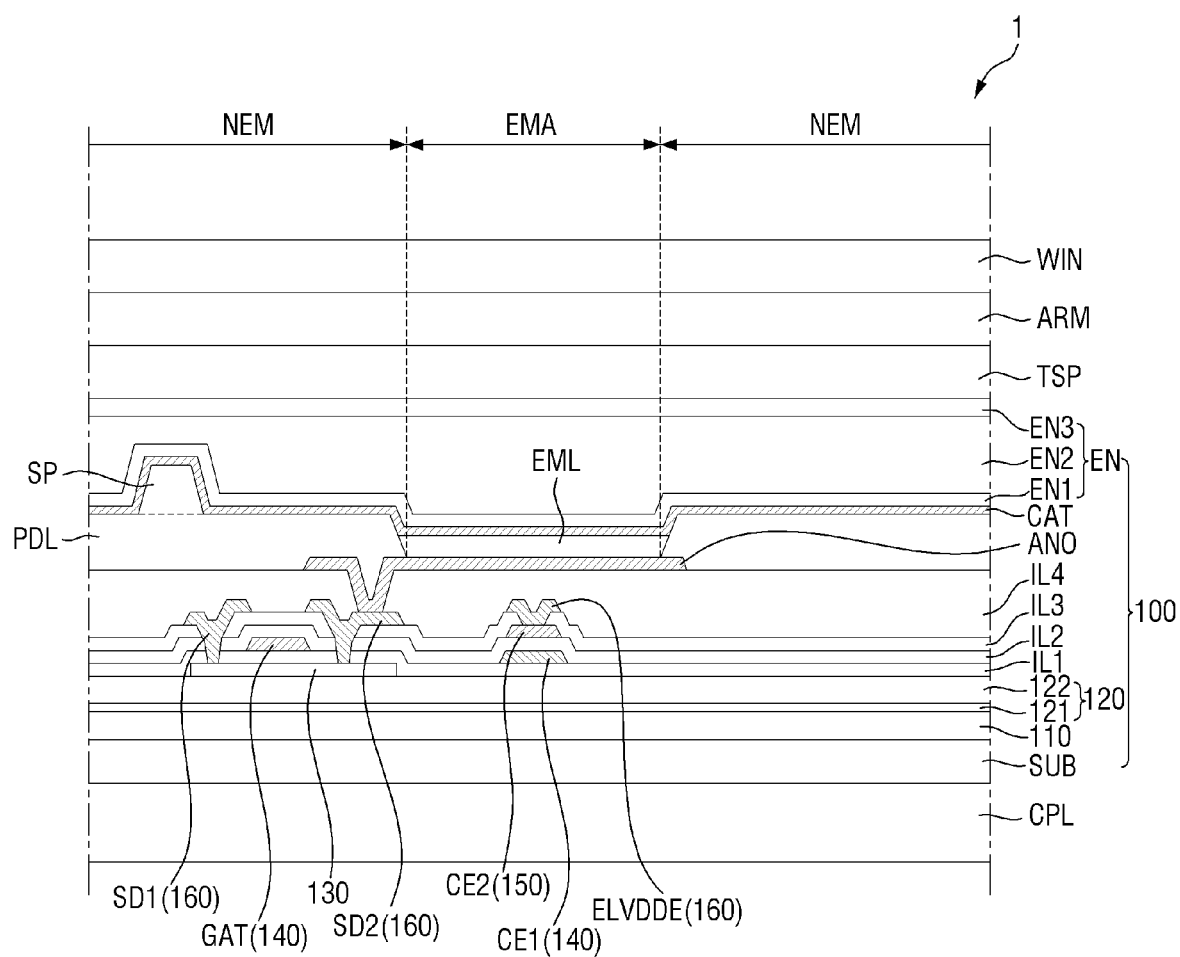
FIG. 4 is a cross-sectional view of the display device of FIG. 1.

FIG. 4 is a cross-sectional view of a display device according to an embodiment.

Referring to FIG. 4, the display device 1 according to an embodiment may include a lower cover member CPL, the display panel 100, a touch member TSP, an anti-reflection member ARM, and a cover window WIN. The lower cover member CPL, the display panel 100, the touch member TSP, the anti-reflection member ARM, and the cover window WIN may be sequentially stacked. At least one bonding member such as an adhesive layer or a tackifying layer may be disposed between the stacked members to bond the adjacent stacked members, but embodiments are not limited thereto. For example, another layer may be further disposed between the respective layers, and some of the stacked members may be omitted.

The display panel 100 may include a base substrate SUB, a barrier layer 110, a buffer layer 120, a semiconductor layer 130, a first insulating layer IL1, a first gate conductive layer 140, a second insulating layer IL2, a second gate conductive layer 150, a third insulating layer IL3, a data conductive layer 160, a fourth insulating layer IL4, an anode electrode ANO, a pixel defining layer PDL including an opening exposing the anode electrode ANO, a light emitting layer EML disposed in the opening of the pixel defining layer PDL, a cathode electrode CAT disposed on the light emitting layer EML and the pixel defining layer PDL, and a thin film encapsulation layer EN disposed on the cathode electrode CAT. Each of the layers described above may consist of a single layer, or a stack of multiple layers. Other layers may be further disposed between the layers.

The base substrate SUB supports the respective layers disposed thereon. The base substrate SUB may be formed of an insulating material such as a polymer resin. Examples of the polymer material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), or a combination thereof. The substrate may be made of an inorganic material such as glass or quartz. However, embodiments are not limited thereto. For example, the base substrate SUB may be a transparent plate or a transparent film. In addition, the base substrate SUB may include a plurality of organic layers and an inorganic layer interposed therebetween.

The base substrate SUB may be a flexible substrate which can be bent, folded, or rolled, but embodiments are not limited thereto. For example, the base substrate SUB may be a rigid substrate.

The barrier layer 110 is disposed on the base substrate SUB. The barrier layer 110 may prevent diffusion of impurity ions, prevent permeation of moisture or external air, and perform a surface planarization function. The barrier layer 110 may include silicon oxide (SiOx). However, without being limited thereto, it may include silicon nitride (SiNx), silicon oxynitride (SiOxNy), or the like. The barrier layer 110 may be omitted according to the type of the base substrate SUB, process conditions, and the like.

The barrier layer 110 and the buffer layer 120 may be formed separately. In this case, after performing the process of forming the barrier layer 110, impurities may adhere to the surface of the barrier layer 110 before the process of forming the buffer layer 120 is performed. The impurities may contain carbon (C), fluorine (F), and the like, but embodiments are not limited thereto. Carbon (C), fluorine (F), and the like, which remain on the top surface of the barrier layer 110, may diffuse upward by a process (e.g., excimer laser annealing (ELA) process) of crystallizing the semiconductor layer 130.

As will be described later, after forming the barrier layer 110, the barrier layer 110 may be processed by an ultraviolet (UV) treatment before the buffer layer 120 is formed. When the barrier layer 110 is treated with UV rays, carbon (C) and fluorine (F) present on the surface of the barrier layer 110 may be removed.

For example, the amounts of carbon (C) and fluorine (F) remaining on the surface of the barrier layer 110 may decrease through the UV treatment. This will be described in detail later. The buffer layer 120 is disposed on the barrier layer 110. The buffer layer 120 may include silicon nitride (SiNx), silicon oxide (SiOx), silicon oxynitride (SiOxNy), or the like. The buffer layer 120 may include two layers containing different materials. The buffer layer 120 may include a first buffer layer 121 containing silicon nitride (SiOx) and a second buffer layer 122 containing silicon oxide (SiOx). The second buffer layer 122 may be disposed on the first buffer layer 121. Hereinafter, in order to distinguish the first buffer layer 121 and the second buffer layer 122 from the buffer layer 120 including the same, the first buffer layer 121 and the second buffer layer 122 are respectively referred to as a first buffer film 121 and a second buffer film 122.

By controlling a film formation rate (e.g., deposition rate) of the second buffer film 122, out-gassing due to hydrogen (H) contained in the second buffer film 122 may be reduced. In addition, by performing a plasma treatment on the buffer layer 120, out-gassing occurring in the buffer layer 120 can be reduced. For example, out-gassing may refer to the release of a gas that was dissolved, trapped, frozen, or absorbed previously. This will be described in detail later.

The semiconductor layer 130 is disposed on the buffer layer 120. The semiconductor layer 130 forms a channel of a thin film transistor of the pixel PX (see FIG. 3). The semiconductor layer 130 may include polycrystalline silicon. In the case where the semiconductor layer 130 is made of polycrystalline silicon, the polycrystalline silicon may be formed by crystallizing amorphous silicon by a crystallization method such as a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method. However, embodiments are not limited thereto. For example, the semiconductor layer 130 may include at least one of monocrystalline silicon, low-temperature polycrystalline silicon, amorphous silicon, or an oxide semiconductor.

The semiconductor layer 130 may be formed by crystallizing all amorphous silicon disposed over the entire area of a target substrate and then patterning the crystalized silicon. Alternatively, the semiconductor layer 130 may be formed by first patterning an amorphous silicon thin film and then crystallizing the patterned amorphous silicon thin film. However, embodiments are not limited thereto. For example, only a partial region of the amorphous silicon thin film may be crystallized, so that the semiconductor layer 130 may include an amorphous silicon region in which amorphous silicon is disposed, and a polycrystalline silicon region in which polycrystalline silicon is disposed.

In the crystallization process of the semiconductor layer 130, out-gassing occurring in the barrier layer 110 and the buffer layer 120 which are disposed thereunder, and out-gassing occurring inside the semiconductor layer 130 may cause defects such as film breakage in the semiconductor layer 130. Thus, out-gassing may result in defects such as a stain in the display device 1 (see FIG. 1). Therefore, it is necessary to control out-gassing in each of the components disposed under the semiconductor layer 130. This will be described in detail later.

The first insulating layer IL1 is disposed on the semiconductor layer 130. The first insulating layer IL1 may be a gate insulating layer having a gate insulating function. The first insulating layer IL1 may include a silicon compound, a metal oxide, or the like. For example, the first insulating layer IL1 may include silicon oxide, silicon nitride, silicon oxynitride, aluminum oxide, tantalum oxide, hafnium oxide, zirconium oxide, titanium oxide, or the like.

The first gate conductive layer 140 is disposed on the first insulating layer IL1. The first gate conductive layer 140 may include a gate electrode GAT of the thin film transistor of the pixel, a scan line connected to the gate electrode GAT, and a first electrode CE1 of a storage capacitor.

The first gate conductive layer 140 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The second insulating layer IL2 may be disposed on the first gate conductive layer 140. The second insulating layer IL2 may be an interlayer insulating layer or a second gate insulating layer. The second insulating layer IL2 may include an inorganic insulating material such as silicon oxide, silicon nitride, silicon oxynitride, hafnium oxide, aluminum oxide, titanium oxide, tantalum oxide, zinc oxide and the like.

The second gate conductive layer 150 is disposed on the second insulating layer IL2. The second gate conductive layer 150 may include a second electrode CE2 of the storage capacitor. The second gate conductive layer 150 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The second gate conductive layer 150 may be made of the same material as the first gate conductive layer 140, but embodiments are not limited thereto.

The third insulating layer IL3 is disposed on the second gate conductive layer 150. The third insulating layer IL3 may be an interlayer insulating layer. The third insulating layer IL3 may include an inorganic insulating material such as silicon oxide, silicon nitride, silicon oxynitride, hafnium oxide, aluminum oxide, titanium oxide, tantalum oxide, zinc oxide and the like.

The data conductive layer 160 is disposed on the third insulating layer IL3. The data conductive layer 160 may include a first electrode SD1, a second electrode SD2 and a first power line ELVDD of the thin film transistor of the pixel (e.g., PX in FIG. 3). The first electrode SD1 and the second electrode SD2 of the thin film transistor may be electrically connected to a source region and a drain region of the semiconductor layer 130 via contact holes passing through the third insulating layer IL3, the second insulating layer IL2 and the first insulating layer IL1. The first power electrode ELVDDE may be electrically connected to the second electrode CE2 of the storage capacitor through a contact hole penetrating the third insulating layer IL3.

The data conductive layer 160 may include at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The data conductive layer 160 may be a single layer or a multilayer. For example, the data conductive layer 160 may have a stacked structure of Ti/Al/Ti, Mo/Al/Mo, Mo/AlGe/Mo, or Ti/Cu.

The fourth insulating layer IL4 is disposed on the data conductive layer 160. The fourth insulating layer IL4 covers the data conductive layer 160. The fourth insulating layer IL4 may be a via layer. When the fourth insulating layer IL4 contains an organic material, the fourth insulating layer IL4 may have a top surface that is substantially flat although a stepped portion is formed at a lower portion thereof. The fourth insulating layer IL4 may include an organic insulating material selected from the group consisting of acrylic resin, epoxy resin, phenolic resin, polyamide resin, polyimide resin, unsaturated polyester resin, polyphenylene resin, polyphenylenesulfide resin and benzocyclobutene (BCB).

The anode electrode ANO is disposed on the fourth insulating layer IL4. The anode electrode ANO may be a pixel electrode provided for each pixel (e.g., 'PX' in FIG. 3). The anode electrode ANO may be connected to the second electrode SD2 of the thin film transistor via the contact hole passing through the fourth insulating layer IL4. The anode electrode ANO may at least partially overlap an emission area EMA of the pixel (e.g., 'PX' in FIG. 3).

The anode electrode ANO may have a stacked structure formed by stacking a material layer having a high work function, such as indium tin oxide (ITO), indium zinc oxide (IZO), zinc oxide (ZnO) and indium oxide (In2O3), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a mixture thereof, but embodiments are not limited thereto. The layer having a high work function may be disposed above the reflective material layer and disposed closer to the light emitting layer EML. The anode electrode ANO may have a multilayer structure such as ITO/Mg, ITO/MgF, ITO/Ag and ITO/Ag/ITO, but embodiments are not limited thereto.

The pixel defining layer PDL may be disposed on the anode electrode ANO. The pixel defining layer PDL may be disposed on the anode electrode ANO and may include an opening exposing the anode electrode ANO. Emission areas EMA and non-emission areas NEM may be distinguished by the pixel defining layer PDL and the openings of the pixel defining layer PDL. The pixel defining layer PDL may include an organic insulating material such as acrylic resin, epoxy resin, phenolic resin, polyamide resin, polyimide resin, unsaturated polyester resin, polyphenylene resin, polyphenylenesulfide resin or benzocyclobutene (BCB). The pixel defining layer PDL may include an inorganic material.

A spacer SP may be disposed on the pixel defining layer PDL. The spacer SP may be disposed directly on the pixel defining layer PDL. The spacer SP may overlap the pixel defining layer PDL in the thickness direction (e.g., in the vertical direction). The spacer SP may maintain a gap with a structure disposed thereabove. For example, when an organic material of the light emitting layer EML is deposited through a fine metal mask (FMM), the spacer SP may prevent sagging of the FMM. In some cases, the spacer SP may also support the structure stacked thereabove, and mitigate or reduce deformation caused by stress when the display panel 100 is pressed. The spacer SP may have a narrower width (e.g., in the horizontal direction) than the pixel defining layer PDL. The spacer SP may be disposed only on a partial region of the pixel defining layer PDL, may cause a stepped portion with respect to a region where the spacer SP is not disposed.

The spacer SP may include an organic insulating material, similarly to the pixel defining layer PDL. The spacer SP and the pixel defining layer PDL may be formed as separate layers, or may be made of the same material and formed by one process. For example, the pixel defining layer PDL and the spacer SP having different heights may be formed through one process of applying a photosensitive organic material and then performing exposure and development using a slit mask or a halftone mask.

The light emitting layer EML is disposed on the anode electrode ANO exposed by the pixel defining layer PDL. The light emitting layer EML may include an organic material layer. The organic material layer of the light emitting layer may include an organic light emitting layer, and may further include a hole injecting/transporting layer and/or an electron injecting/transporting layer.

The cathode electrode CAT may be disposed on the light emitting layer EML. The cathode electrode CAT may be a common electrode extended across all the pixels. The anode electrode ANO, the light emitting layer EML, and the cathode electrode CAT may constitute the light emitting element OLED (see FIG. 3).

The cathode electrode CAT may be in contact with the light emitting layer EML as well as the top surface of the pixel defining layer PDL. Further, in the region where the spacer SP is formed, the cathode electrode CAT may cover the surface of the spacer SP, while being in contact with the surface of the spacer SP. The cathode electrode CAT may be conformally formed along the lower structure to reflect the stepped portions of the lower structure.

The cathode electrode CAT may include a material layer having a low work function, such as Li, Ca, LiF/Ca, LiF/Al, Al, Mg, Ag, Pt, Pd, Ni, Au Nd, Ir, Cr, BaF, Ba or a compound or mixture thereof (e.g., a mixture of Ag and Mg). The cathode electrode CAT may further include a transparent metal oxide layer disposed on the material layer having a low work function.

The thin film encapsulation layer EN including a first inorganic film EN1, a first organic film EN2 and a second inorganic film EN3 is disposed on the cathode electrode CAT. The first inorganic film EN1 and the second inorganic film EN3 may be in contact with each other at an end portion of the thin film encapsulation layer EN. The first organic film EN2 may be sealed by the first inorganic film EN1 and the second inorganic film EN3.

Each of the first inorganic film EN1 and the second inorganic film EN3 may include silicon nitride, silicon oxide, silicon oxynitride, or the like. The first organic film EN2 may include an organic insulating material.

The touch member TSP may be disposed on the display panel 100. The touch member TSP may sense a touch input. The touch member TSP may be provided in a panel. For example, the touch member TSP may be provided in the form of a touch layer inside the display panel 100. Alternatively, the touch member TSP may be a film separate from the display panel 100 as illustrated, and may be attached onto the display panel 100.

The anti-reflection member ARM may be disposed on the touch member TSP. The anti-reflection member ARM may polarize light passing therethrough or selectively transmit light having a specific wavelength. The anti-reflection member ARM may reduce the reflection of external light.

The cover window WIN may be disposed on the touch member TSP. The cover window WIN may cover and protect the display panel 100. The cover window WIN may be made of a transparent material. The cover window WIN may be made of, for example, glass or plastic.

The lower cover member CPL may be disposed below the display panel 100. The lower cover member CPL may block light. For example, the lower cover member CPL may block light from entering the display panel 100 from the outside. Further, the lower cover member CPL may perform an impact absorbing function other than the light blocking function.

Hereinafter, the barrier layer 110, the buffer layer 120, and the semiconductor layer 130 capable of suppressing or preventing film breakage in the semiconductor layer 130 will be described in detail with reference to FIGS. 5 to 11.

Figure 5:
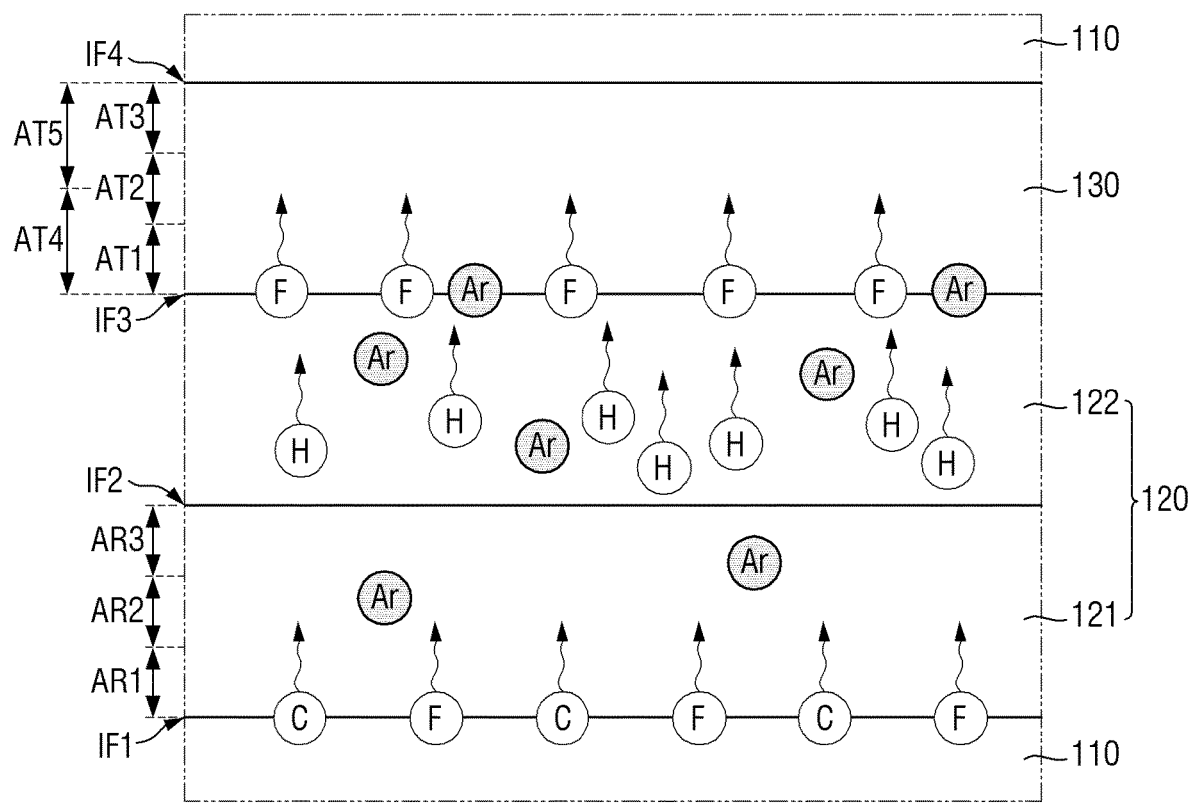
FIG. 5 is an enlarged cross-sectional view of a buffer layer and peripheries of the buffer layer of FIG. 4.
Figure 6:
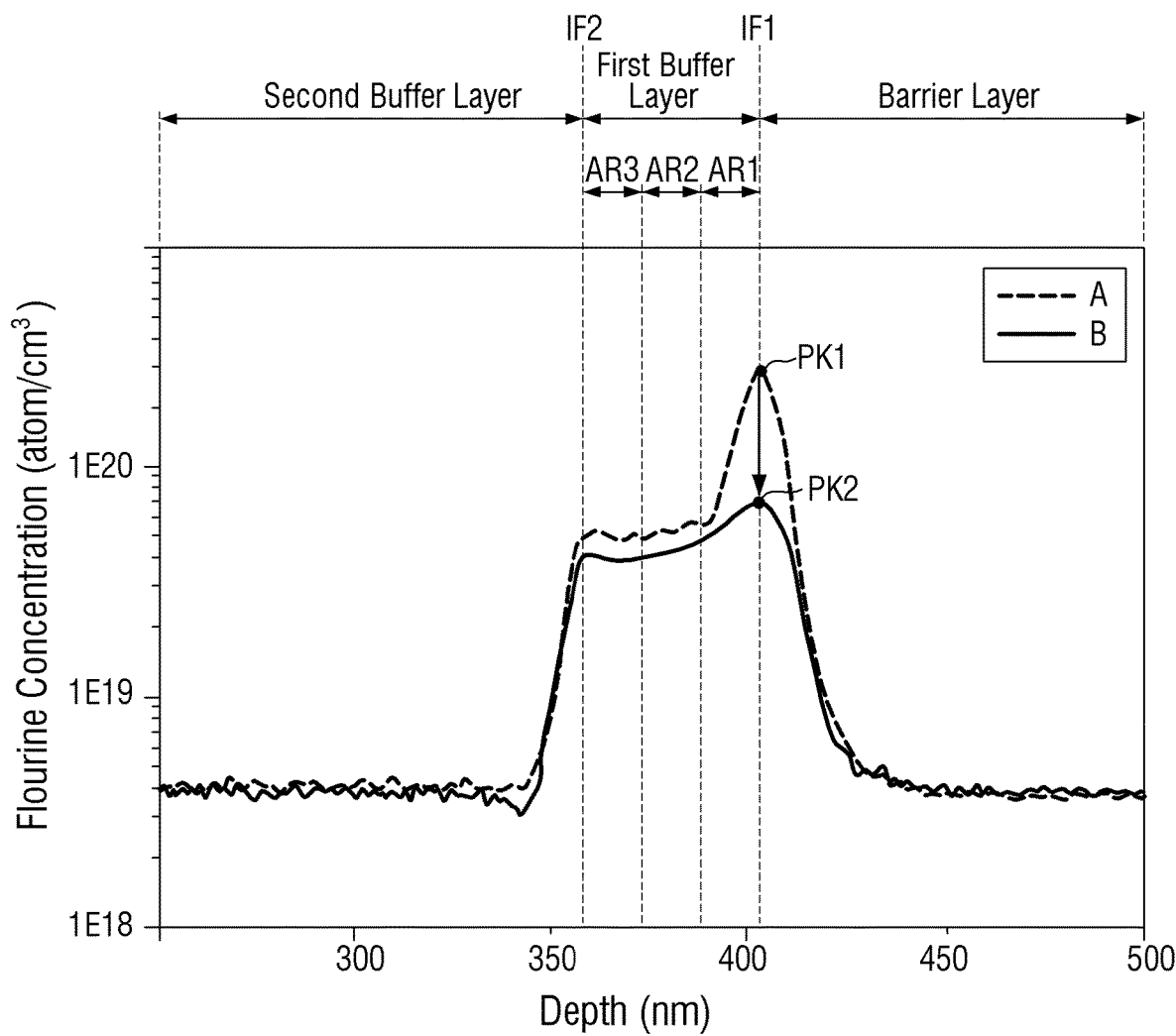
FIG. 6 illustrates a graph showing fluorine (F) concentrations of the buffer layer and the barrier layer of FIG. 4.
Figure 7:
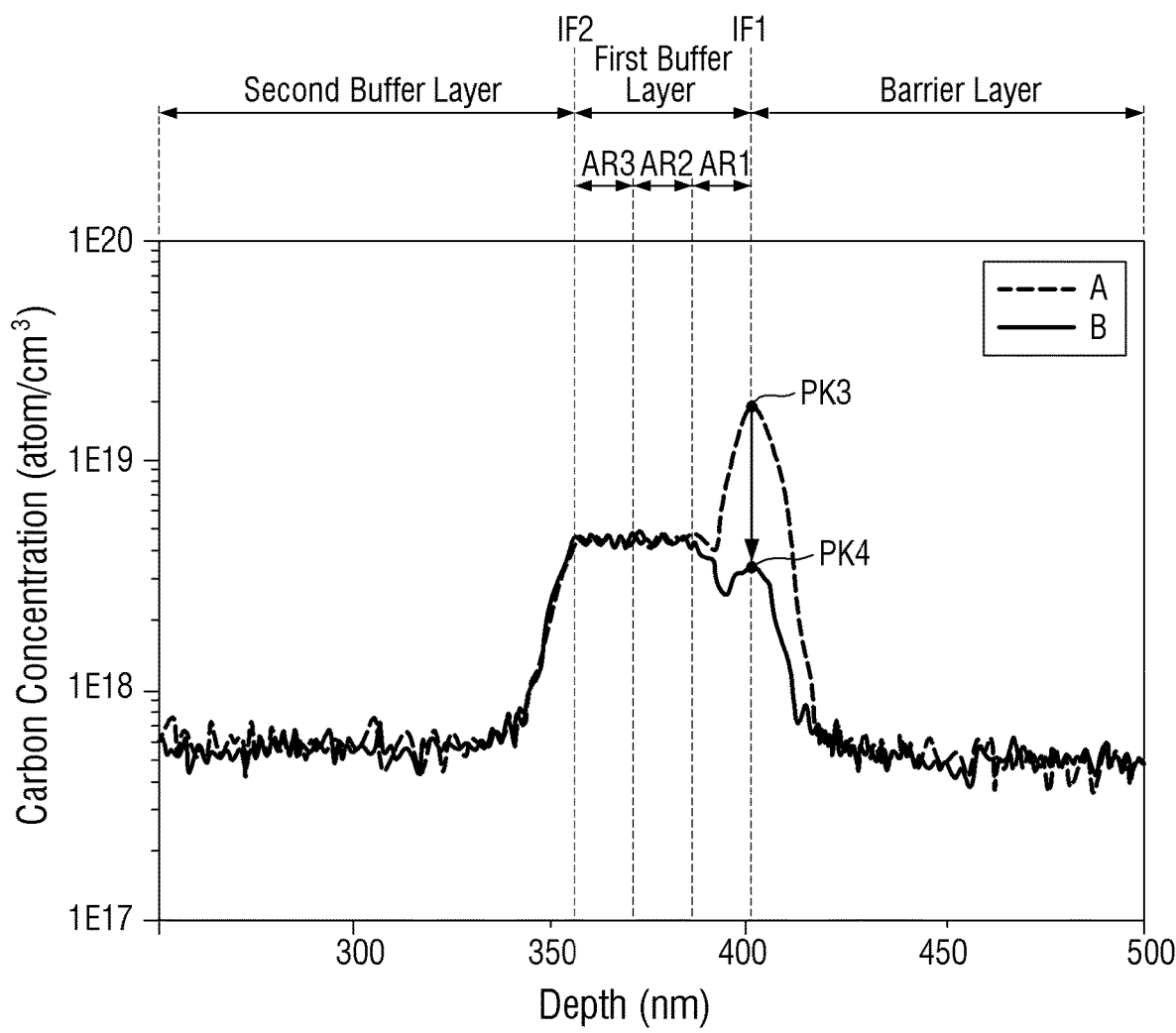
FIG. 7 illustrates a graph showing carbon (C) concentrations of the buffer layer and the barrier layer of FIG. 4.

First, reference is made to FIGS. 5 to 7 to describe concentrations of carbon (C) and fluorine (F) in the first buffer film 121 according to UV treatment performed on the barrier layer 110.

FIG. 5 is an enlarged cross-sectional view of a buffer layer and its peripheries according to an embodiment. FIG. 6 illustrates a graph showing fluorine (F) concentrations of a buffer layer and a barrier layer of a display device according to an embodiment. FIG. 7 illustrates a graph showing carbon (C) concentrations of a buffer layer and a barrier layer of a display device according to an embodiment.

FIG. 5 schematically illustrates a state in which hydrogen (H), carbon (C), and fluorine (F) diffuse upward from the barrier layer 110, the buffer layer 120, and the semiconductor layer 130. In FIGS. 6 and 7, the line A shows a case where the surface of the barrier layer 110 is not treated with UV rays, and the line B shows a case where the surface of the barrier layer 110 is treated with UV rays. Horizontal axes of FIGS. 6 and 7 represent a depth (nm) in the thickness direction, a vertical axis of FIG. 6 represents a fluorine (F) concentration (atoms/cm$^3$), and a vertical axis of FIG. 7 represents a carbon (C) concentration (atoms/cm$^3$). FIGS. 6 and 7 show results measured by using secondary ion mass spectrometry (SIMS).

First, referring further to FIGS. 5 and 6, in the case of the line B where the UV treatment is performed on the surface of the barrier layer 110, the fluorine (F) concentration of the first buffer film 121 may decrease in comparison with the case of the line A where the UV treatment is not performed on the surface of the barrier layer 110.

Specifically, in the first buffer film 121, an area between a first interface IF1 with the barrier layer 110 and a second interface IF2 with the second buffer film 122 may be divided into three areas in the thickness direction (e.g., in the third direction DR3). The three divided areas of the first buffer film 121 may be referred to as first area AR1, second area AR2, and third area AR3, in the order from the area adjacent to the barrier layer 110.

Peak points PK1 and PK2, at which the fluorine (F) concentration in the first buffer film 121 is the highest value, may be positioned in the first area AR1. In the graph, the line A and the line B respectively have the first peak point PK1 (e.g., a first peak value) and the second peak point PK2 (e.g., a second peak value) in the first area AR1. The fluorine (F) concentration at the second peak point PK2 (e.g., the second peak value) may be lower than the fluorine (F) concentration at the first peak point PK1. For example, the first peak point PK1 and the second peak point PK2 may be located at the first interface IF1 of the first buffer film 121, but embodiments are not limited thereto.

The fluorine (F) concentration at the second peak point PK2 (e.g., the second peak value) may be higher than a fluorine (F) concentration at an intermediate point between the first interface IF1 and the second interface IF2, and may be about 2.5 times or less the fluorine (F) concentration at the intermediate point. However, embodiments are not limited thereto. The fluorine (F) concentration at the second peak point PK2 (e.g., the second peak value) may be higher than the fluorine (F) concentration at the intermediate point, and may be about 2 times or less the fluorine (F) concentration at the intermediate point. For example, the fluorine (F) concentration at the intermediate point may be about 1E20 atoms/cm$^3$ or less, or may be in a range of about 1E18 to about 1E20 atoms/cm$^3$, but embodiments are not limited thereto. The intermediate point may be positioned in the second area AR2. In addition, a distance between the intermediate point and the first interface IF1 may be the same as a distance between the intermediate point and the second interface IF2.

Alternatively, the fluorine (F) concentration at the second peak point PK2 may be higher than an average fluorine (F) concentration of the second area AR2, and may be about 2.5 times or less the average fluorine (F) concentration of the second area AR2. The average fluorine (F) concentration of the second area AR2 may be about 1E20 atoms/cm$^3$ or less, or may be in a range of about 1E18 to about 1E20 atoms/cm$^3$.

Alternatively, the fluorine (F) concentration at the second peak point PK2 may be about 2.5 times or less a fluorine (F) concentration at an arbitrary point in the second area AR2. For example, the fluorine (F) concentration at the second peak point PK2 may be higher than the fluorine (F) concentration at an arbitrary point in the second area AR2, and may be about 2.5 times or less the fluorine (F) concentration at an arbitrary point in the second area AR2.

Next, referring to FIGS. 5 and 7, in the case of the line B where the UV treatment is performed on the surface of the barrier layer 110, the carbon (C) concentration of the first buffer film 121 may decrease in comparison with the case of the line A where the UV treatment is not performed on the surface of the barrier layer 110.

Specifically, in the first buffer film 121, an area between a first interface IF1 with the barrier layer 110 and a second interface IF2 with the second buffer film 122 may be divided into three areas in the thickness direction (e.g., in the third direction DR3). The three divided areas of the first buffer film 121 may be referred to as a first area AR1, a second area AR2, and a third area AR3 in the order from the area adjacent to the barrier layer 110.

Peak points PK3 and PK4, at which the carbon (C) concentration in the first buffer film 121 is the highest value, may be positioned in the first area AR1. In the graph, the line A and the line B respectively have the third peak point PK3 (e.g., a third peak value) and the fourth peak point PK4 (e.g., a fourth peak value) in the first area AR1. The carbon (C) concentration at the fourth peak point PK4 (e.g., the fourth peak value) may be lower than the carbon (C) concentration at the third peak point PK3. For example, the third peak point PK3 and the fourth peak point PK4 may be located at the first interface IF1 of the first buffer film 121, but embodiments are not limited thereto.

The carbon (C) concentration at the fourth peak point PK4 (e.g., the fourth peak value) may be about 2.5 times or less a carbon (C) concentration at an intermediate point between the first interface IF1 and the second interface IF2. Further, the carbon (C) concentration at the fourth peak point PK4 may be lower than the carbon (C) concentration at the intermediate point between the first interface IF1 and the second interface IF2. However, embodiments are not limited thereto. The carbon (C) concentration at the fourth peak point PK4 (e.g., the fourth peak value) may be about 2 times or less the carbon (C) concentration at the intermediate point. The intermediate point may be positioned in the second area AR2. In addition, a distance between the intermediate point and the first interface IF1 may be the same as a distance between the intermediate point and the second interface IF2.

The carbon (C) concentration at the intermediate point may be about 1E20 atoms/cm$^3$ or less, or may be about 1E19 atoms/cm$^3$ or less, but embodiments are not limited thereto. Alternatively, the carbon (C) concentration at the intermediate point may be in a range of about 1E17 to about 1E20 atoms/cm$^3$ or in a range of about 1E18 to about 1E19 atoms/cm$^3$. Alternatively, the carbon (C) concentration at the fourth peak point PK4 may be about 2.5 times or less an average carbon (C) concentration of the second area AR2. Further, the carbon (C) concentration at the fourth peak point PK4 may be lower than an average carbon (C) concentration of the second area AR2.

Alternatively, the carbon (C) concentration at the fourth peak point PK4 may be about 2.5 times or less a carbon (C) concentration at an arbitrary point in the second area AR2. For example, the carbon (C) concentration at the fourth peak point PK4 may be about 2.5 times or less the carbon (C) concentration at an arbitrary point in the second area AT2. Further, the carbon (C) concentration at the fourth peak point PK4 may be lower than the carbon (C) concentration at an arbitrary point in the second area AR2.

For example, as the surface of the barrier layer 110 is treated with UV rays, the amounts of carbon (C) and fluorine (F) remaining on the surface of the barrier layer 110 may decrease. Thus, the amounts of carbon (C) and fluorine (F) diffusing from the surface of the barrier layer 110 to the first buffer film 121 may be reduced. Accordingly, in the crystallization process of the semiconductor layer 130, out-gassing, which may occur due to carbon (C) and/or fluorine (F), can be suppressed or prevented. Therefore, defects due to film breakage in the semiconductor layer 130 may be suppressed or prevented.

However, embodiments are not limited thereto. The barrier layer 110 and the first buffer film 121 may be successively formed, and the first buffer film 121 and the second buffer film 122 may be separately formed. In this case, the above-described impurities may adhere to the surface of the first buffer film 121, and thus the surface of the first buffer film 121 may be treated with UV rays. Further, the descriptions of the first peak point PK1 and the second peak point PK2 may be applied to the third area AR3 and the second interface IF2, rather than being applied to the first area AR1 and the first interface IF1.

Not only performing UV treatment on the barrier layer 110, but also reducing a film formation rate (e.g., deposition rate) of the second buffer film 122 may decrease a concentration of hydrogen (H) contained in the second buffer film 122. This will be described in detail later. According to conditions for forming the second buffer film 122, out-gassing that may occur during the crystallization process of the semiconductor layer 130 may be suppressed or prevented.

Figure 8:
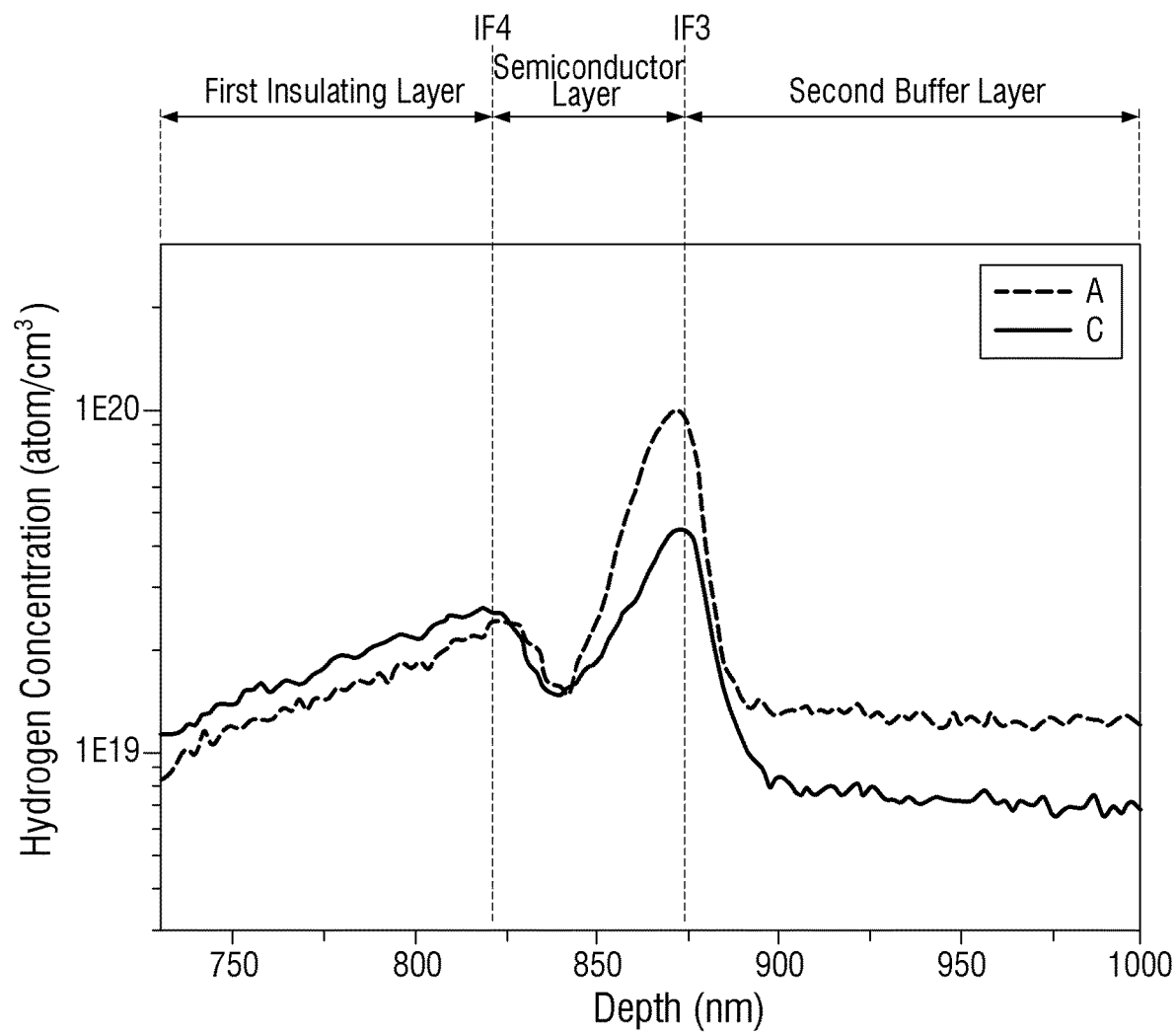
FIG. 8 illustrates a graph showing hydrogen (H) concentrations of embodiments of the first insulating layer, the semiconductor layer, and the buffer layer of FIG. 4.
Figure 9:
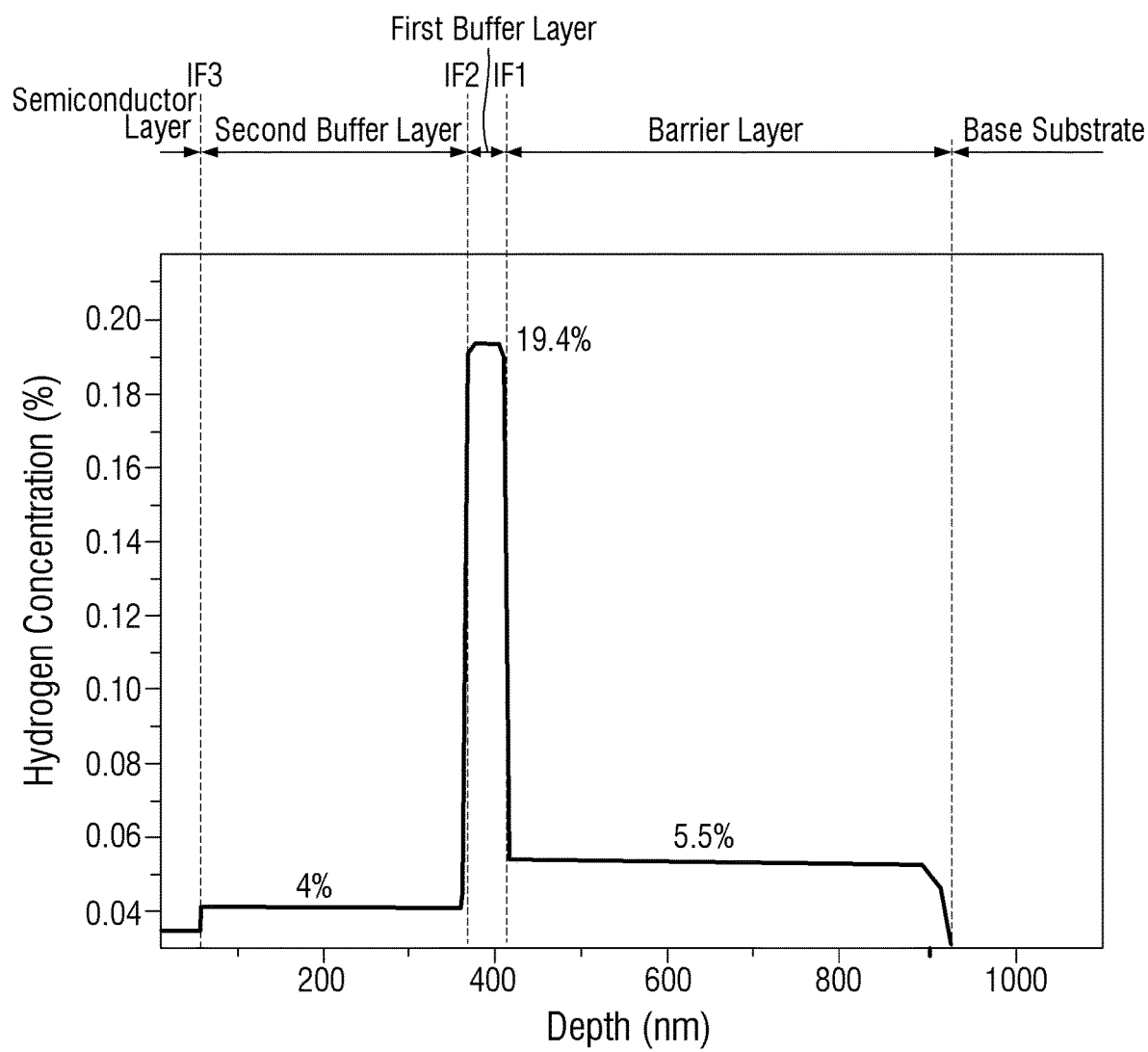
FIG. 9 illustrates a graph showing hydrogen (H) concentrations of other embodiments of the first insulating layer, the semiconductor layer, and the buffer layer of FIG. 4.
Figure 10:
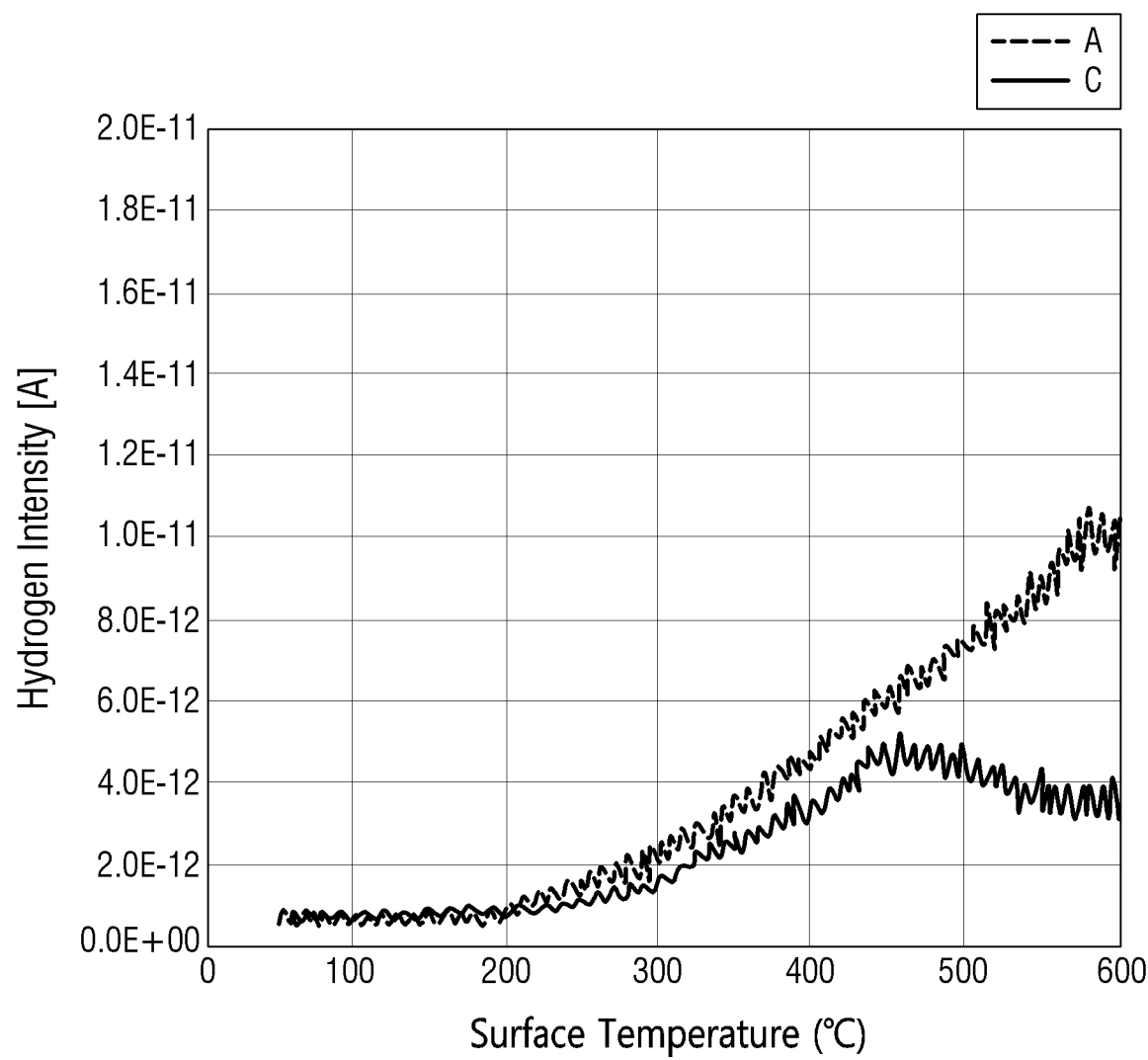
FIG. 10 illustrates a graph showing the amount of hydrogen (H) gas released from a buffer layer according to the temperature thereof.

Reference is made to FIGS. 8 to 10 in order to describe this in detail.

FIG. 8 illustrates a graph showing hydrogen (H) concentrations of a first insulating layer, a semiconductor layer, and a buffer layer of a display device according to an embodiment. FIG. 9 illustrates a graph showing hydrogen (H) concentrations of a first insulating layer, a semiconductor layer, and a buffer layer of a display device according to an embodiment. FIG. 10 illustrates a graph showing the amount of hydrogen (H) gas released from a buffer layer according to the temperature thereof.

FIG. 8 shows results measured by using SIMS. The graph of FIG. 9 shows a result measured by using Rutherford backscattering spectrometry (RBS). The graph of FIG. 10 shows results measured by using thermal desorption spectroscopy (TDS).

In FIGS. 8 and 9, horizontal axes represent depths of the semiconductor layer 130, the buffer layer 120, and the barrier layer 110 in the thickness direction (e.g., in the third direction DR3) according to an embodiment, and vertical axes represent hydrogen (H) concentrations (atoms/cm$^3$, at %). In FIG. 10, a horizontal axis represents a temperature of the second buffer film 122, and a vertical axis represents the amount of hydrogen (H) gas released from the second buffer film 122. FIG. 10 shows the amounts of hydrogen (H) gases released from the second buffer films 122 formed at different deposition rates.

In the graphs of FIGS. 8 and 10, the line A, as a comparative example, represents the amount of hydrogen (H) gas released from the second buffer film 122 that was formed at a deposition rate of about 96.2 Å/sec, and the line C, as an experimental example, represents the amount of hydrogen (H) gas released from the second buffer film 122 which was formed at a deposition rate lower than the deposition rate in the example of the line A. For example, the deposition rate in the example of the line C may be in a range of about 63 to about 66 Å/sec, in a range of about 60 to about 70 Å/sec, or about 64.6 Å/sec, although embodiments are not limited thereto.

First, referring to FIGS. 5 and 8, in the case of the line C where the deposition rate of the second buffer film 122 is relatively low, the hydrogen (H) concentrations of the second buffer film 122 and the semiconductor layer 130 may be lower than those in the case of the line A where the deposition rate is relatively high. The hydrogen (H) concentration may be the highest value at a third interface IF3 between the semiconductor layer 130 and the second buffer film 122. At the third interface IF3, the hydrogen (H) concentration may be lower in the case of the line C where the deposition rate of the second buffer film 122 is relatively low.

The hydrogen (H) concentration of the second buffer film 122 may be in a range of about 1E18 to about 3E21 atoms/cm$^3$ or in a range of about 1E19 to about 3E20 atoms/cm$^3$.

For example, as the deposition rate of the second buffer film 122 decreases, the hydrogen (H) concentration in the vicinity of the third interface IF3 may become lower, thereby reducing out-gassing due to hydrogen (H).

Referring to FIGS. 5 and 9, the second buffer film 122 and the barrier layer 110 according to an embodiment may include the same material. For example, the second buffer film 122 and the barrier layer 110 may include silicon oxide (SiOx). The second buffer film 122 and the barrier layer 110 may be deposited at different deposition rates. The deposition rate of the second buffer film 122 may be lower than the deposition rate of the barrier layer 110. The deposition rate of the second buffer film 122 may be in a range of about 63 to about 66 Å/sec, in a range of about 60 to about 70 Å/sec, or about 64.6 Å/sec. The deposition rate of the barrier layer 110 may be about 96.2 Å/sec, as in the case of the line A of FIG. 10. However, embodiments are not limited to the above-described deposition rates.

The second buffer film 122 and the barrier layer 110 may have different film densities. The second buffer film 122 may have the film density greater than the film density of the barrier layer 110. The film density of the second buffer film 122 may be, for example, in a range of about 2.2 to about 2.25 g/cm$^3$ or in a range of about 2.15 to about 2.40 g/cm$^3$, but embodiments are not limited thereto. The film density of the second buffer film 122 may be calculated by measuring a weight per unit volume.

The second buffer film 122 and the barrier layer 110 may have different hydrogen (H) concentrations. The second buffer film 122 may have the hydrogen (H) concentration lower than the hydrogen (H) concentration of the barrier layer 110. For example, the hydrogen (H) concentration of the second buffer film 122 may be in a range of about 3 to about 5 at %, in a range of about 3.5 to about 4.5 at %, or about 4 at %, but embodiments are not limited thereto.

Subsequently, referring further to FIG. 10, in the case of the line C where the deposition rate is relatively low, the amount of hydrogen (H) gas released from the second buffer film 122 may be lower than the case of the line A where the deposition rate is relatively high. For example, when the deposition rate of the second buffer film 122 decreases, the amount of hydrogen (H) gas released from the second buffer film 122 may be reduced.

For example, although the second buffer film 122 and the barrier layer 110 contain the same material (e.g., silicon oxide (SiOx)), when the deposition rate of the second buffer film 122 decreases, the film density of the second buffer film 122 may increase, and the hydrogen (H) concentration in the second buffer film 122 may decrease. As the hydrogen (H) concentration in the second buffer film 122 decreases, the amount of hydrogen (H) gas, which is released from the second buffer film 122, may decrease even when the crystallization process of the semiconductor layer 130 is performed. Therefore, out-gassing, which may occur due to hydrogen (H), can be suppressed or prevented. Accordingly, defects due to a stain or film breakage of the semiconductor layer 130 may be suppressed or prevented.

In addition to performing the UV treatment on the barrier layer 110 and decreasing the deposition rate of the second buffer film 122, the buffer layer 120 may be plasma treated, thereby removing impurities on the surface of the buffer layer 120, and decreasing out-gassing due to the impurities.

For example, after depositing the buffer layer 120, impurities may adhere to the surface of the buffer layer 120 by a cleaning process of the surface of the buffer layer 120, before the semiconductor layer 130 is deposited. The impurities may contain fluorine (F) and the like. Fluorine (F) and the like remaining on the top surface of the buffer layer 120 may be diffused upward by the crystallization process (e.g., ELA process) of the semiconductor layer 130. As will be described later, after the buffer layer 120 is deposited and cleaned, when the buffer layer 120 is plasma treated, fluorine (F) remaining on the surface of the buffer layer 120 may be removed. For example, the amount of fluorine (F) remaining on the surface of the buffer layer 120 may be decreased by the plasma treatment. The plasma treatment may be performed using a plasma of argon (Ar) gas, but embodiments are not limited thereto.

Figure 11:
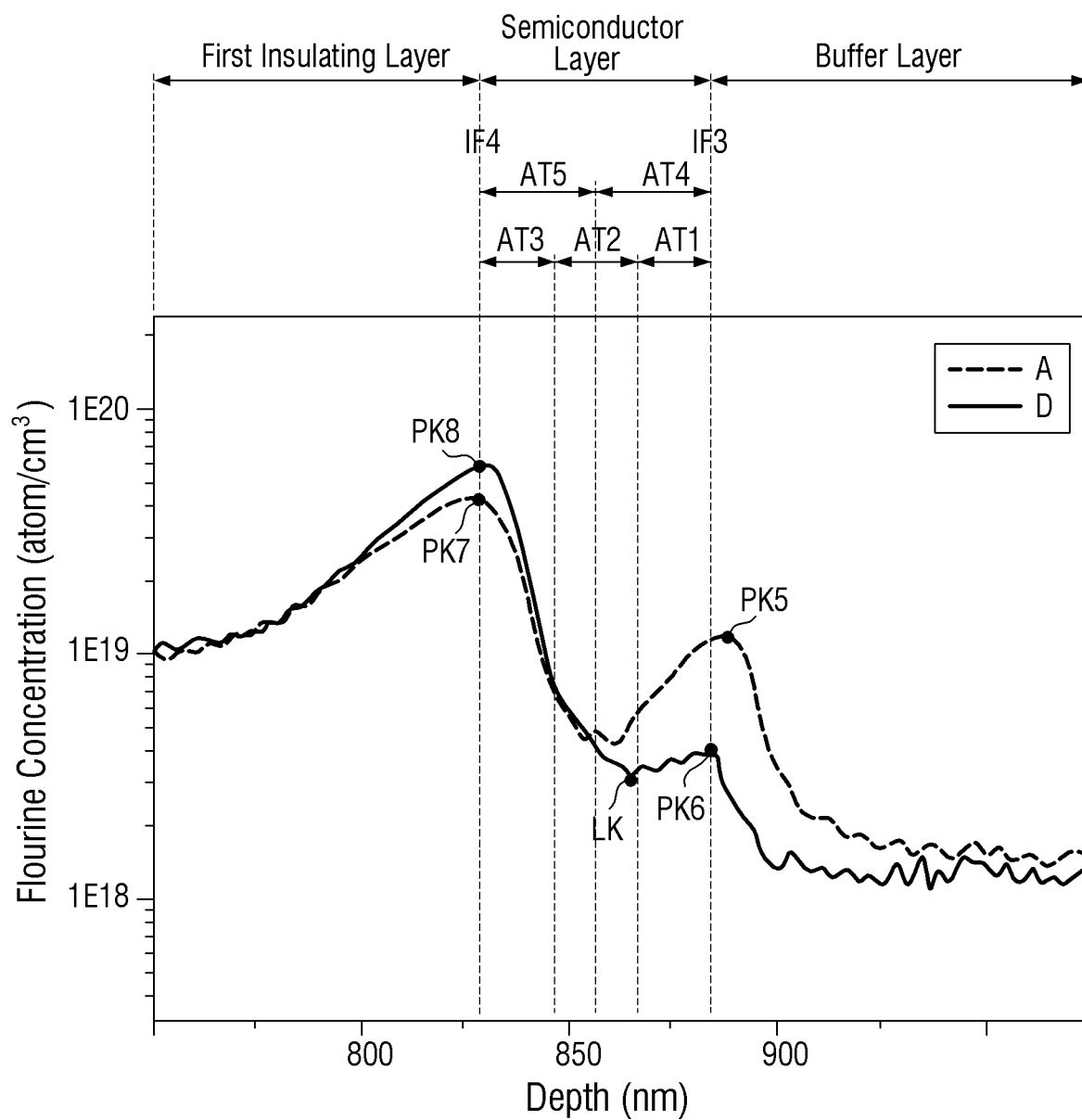
FIG. 11 illustrates a graph showing fluorine (F) concentrations of other embodiments of the semiconductor layer and the peripheries of the display device of FIG. 1.

Reference is made to FIG. 11 to describe a fluorine (F) concentration of the semiconductor layer 130 according to plasma treatment performed on the buffer layer 120.

FIG. 11 illustrates a graph showing fluorine (F) concentrations of a semiconductor layer and its peripheries of a display device according to an embodiment. FIG. 11 shows results measured by using SIMS. In the graph of FIG. 11, the line A shows a case where the surface of the buffer layer 120 is not plasma treated, and the line D shows a case where the surface of the buffer layer 120 is plasma treated. In FIG. 11, a horizontal axis represents depths of the first insulating layer IL1 the semiconductor layer 130, and the buffer layer 120 in the thickness direction (e.g., in the third direction DR3), and a vertical axis represents a distribution of fluorine (F). Further, the horizontal axis of FIG. 11 may represent a sputtering time.

Referring to FIGS. 5 and 11, in the case of the line D where the plasma treatment is performed on the surface of the buffer layer 120, the fluorine (F) concentrations of the semiconductor layer 130 and the buffer layer 120 may decrease in comparison with the case of the line A where the plasma treatment is not performed on the surface of the buffer layer 120.

Specifically, the semiconductor layer 130 (e.g., an area between a third interface IF3 with the buffer layer 120 and a fourth interface IF4 with the first insulating layer IL1) may be divided into three areas in the thickness direction (e.g., in the third direction DR3). The three divided areas of the semiconductor layer 130 may be referred to as a first area AT1, a second area AT2, and a third area AT3 in the order from the area adjacent to the buffer layer 120. In addition, the semiconductor layer 130 (e.g., the area between the third interface IF3 with the buffer layer 120 and the fourth interface IF4 with the first insulating layer IL1) may be divided into two areas in the thickness direction (e.g., in the third direction DR3). The two divided areas of the semiconductor layer 130 may be referred to as a fourth area AT4 and a fifth area AT5 in the order from the area adjacent to the buffer layer 120.

In the graph, the line D may have a sixth peak point PK6 (e.g., a sixth peak value) in the first area AT1 and the fourth area AT4, and an eighth peak point PK8 (e.g., an eighth peak value) in the third area AT3 and the fifth area AT5. The sixth peak point PK6 may be located at the third interface IF3, and the eighth peak point PK8 may be located at the fourth interface IF4, but embodiments are not limited thereto. The fluorine (F) concentration of the semiconductor layer 130 at the sixth peak PK6 may be lower than that at the eighth peak point PK8. At the sixth peak point PK6, the fluorine (F) concentration of the semiconductor layer 130 may be about 30% or less, or about 20% or less of the fluorine (F) concentration of the semiconductor layer 130 at the eighth peak point PK8, but embodiments are not limited thereto.

In the graph, the line D may further have a low point LK which is a point having the lowest concentration value between the sixth peak point PK6 and the eighth peak point PK8. The fluorine (F) concentration of the semiconductor layer 130 at the low point LK may be substantially equal to or less than the fluorine (F) concentration of the semiconductor layer 130 at the sixth peak point PK6. The fluorine (F) concentration of the semiconductor layer 130 at the low point LK may be about 1E20 atoms/cm$^3$ or less, but embodiments are not limited thereto. Further, the fluorine (F) concentration of the semiconductor layer 130 at the low point LK may be, for example, in a range of about 1E18 to about 1E19 atoms/cm$^3$ or in a range of about 1E18 to about 1E20 atoms/cm$^3$, but embodiments are not limited thereto.

Furthermore, the low point LK may be located, for example, in the second area AT2 and the fourth area AT4, but embodiments are not limited thereto.

Comparing the line D with the line A, in the case of the line D where the plasma treatment is performed on the surface of the buffer layer 120, the fluorine (F) concentration may be substantially lower than that in the case of the line A, and may be particularly lower in the peripheral regions of the third interface IF3. The fluorine (F) concentration at the fifth peak point PK5 of the case of the line A may be higher than the fluorine (F) concentration at the sixth peak point PK6 of the case of the line D. In addition, the fluorine (F) concentration at the seventh peak point PK7 (e.g., a seventh peak value) of the case of the line A may be lower than the fluorine (F) concentration at the eighth peak point PK8 of the case of the line D.

Therefore, when the plasma treatment is performed on the surface of the buffer layer 120, out-gassing due to fluorine (F) which may occur under the semiconductor layer 130 may be suppressed or prevented, thereby reducing film breakage in the semiconductor layer 130 so as to suppress or prevent accompanying defects.

Hereinafter, a method of fabricating a display device according to an embodiment will be described.

Figure 12:
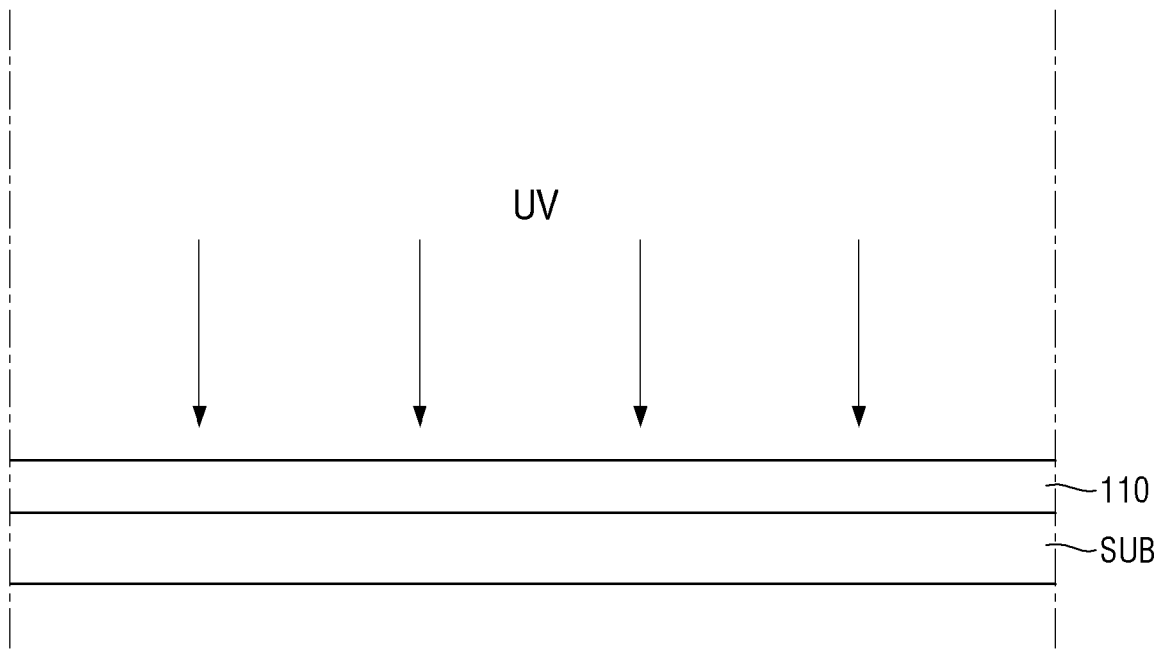
FIGS. 12, 13, 14, 15, and 16 are cross-sectional views illustrating an embodiment of a method of fabricating the display device of FIG. 1.
Figure 13:
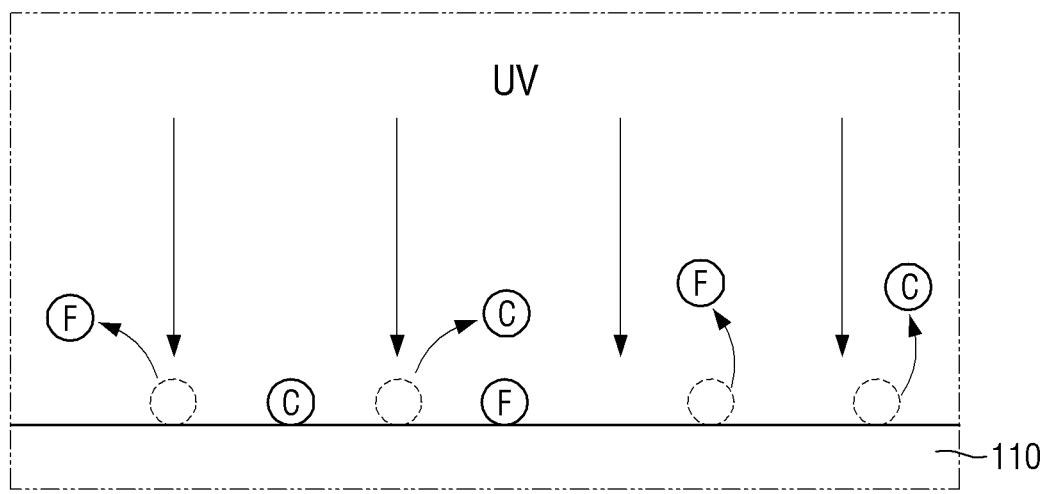
Figure 14:
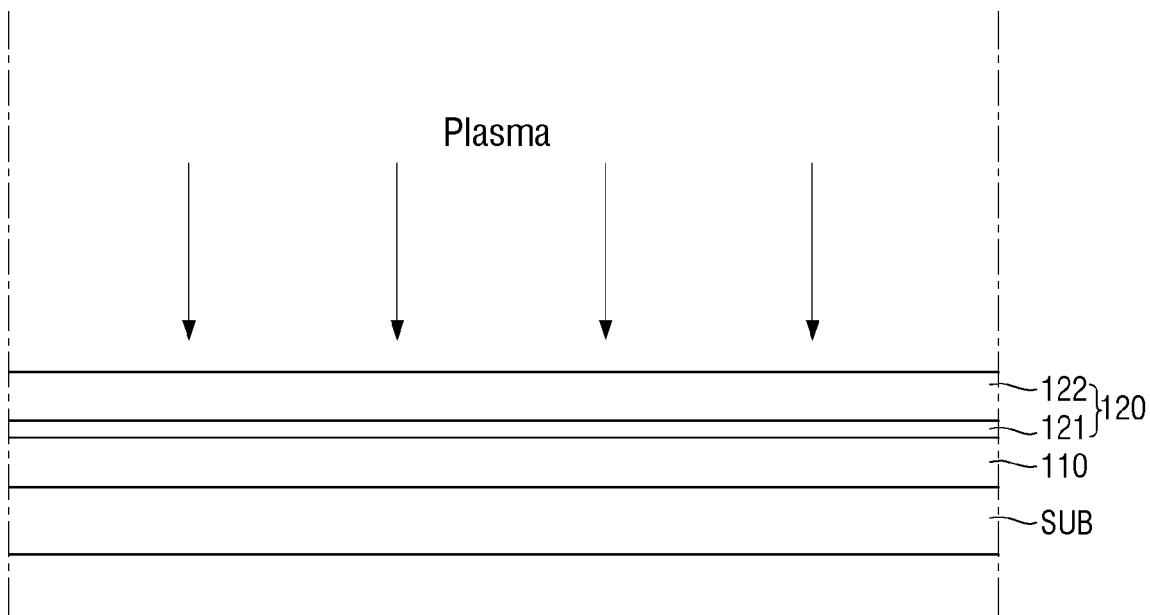
Figure 15:
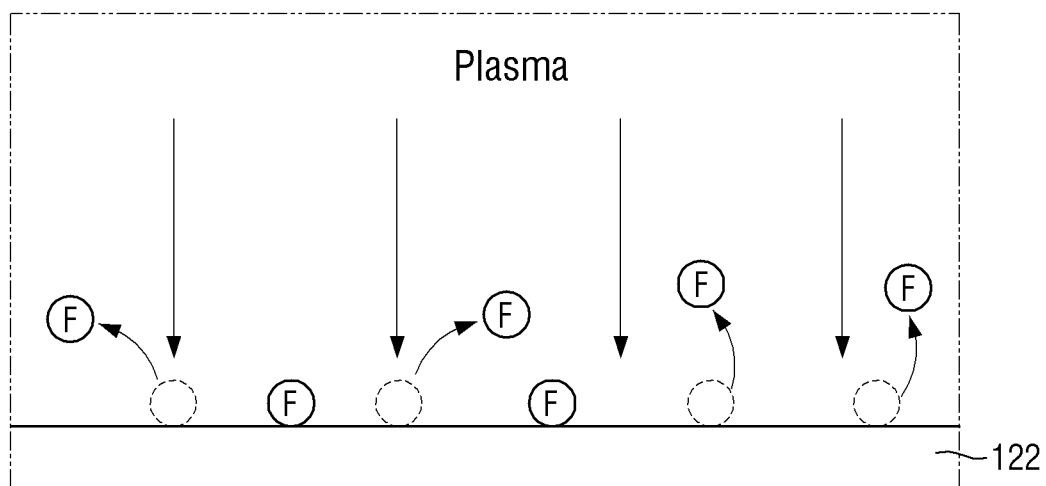

FIGS. 12, 13, 14, 15, and 16 are cross-sectional views illustrating a method of fabricating a display device according to an embodiment. FIG. 13 illustrates an enlarged view of the surface of the barrier layer 110 in FIG. 12. FIG. 15 illustrates an enlarged view of the surface of the second buffer film 122 in FIG. 14.

First, referring to FIGS. 12 and 13, the barrier layer 110 is stacked on the base substrate SUB. The barrier layer 110 may be disposed over the entire surface of the base substrate SUB. The barrier layer 110 may be formed by chemical vapor deposition (CVD), plasma enhanced chemical vapor deposition (PECVD), or the like, but embodiments are not limited thereto.

After the barrier layer 110 is stacked, the surface of the barrier layer 110 is treated with UV rays. In this case, impurities adhered to the surface of the barrier layer 110 may be removed, and the amount of impurities remaining on the surface of the barrier layer 110 may decrease. For example, carbon (C), fluorine (F) and the like may be adhered to the surface of the barrier layer 110, and may be removed by UV treatment, but embodiments are not limited thereto.

Therefore, the amounts of carbon (C), fluorine (F) and the like remaining on the surface of the barrier layer 110 may decrease through the UV treatment. Although the crystallization process (e.g., ELA process) of the semiconductor layer 130 is performed thereafter, the amounts of carbon (C) and fluorine (F) gases diffusing upward from the surface of the barrier layer 110 may decrease. For example, out-gassing occurring on the surface of the barrier layer 110 can be suppressed or prevented, and further, defects such as film breakage in the semiconductor layer 130 can be suppressed or prevented.

Next, referring to FIGS. 14 and 15, the buffer layer 120 is stacked on the barrier layer 110. The buffer layer 120 may be disposed over the entire surface of the barrier layer 110. In the buffer layer 120, the first buffer film 121 and the second buffer film 122 may be sequentially stacked. After the first buffer film 121 is stacked, the second buffer film 122 may be stacked. Each of the first buffer film 121 and the second buffer film 122 of the buffer layer 120 is formed by chemical vapor deposition (CVD), plasma enhanced chemical vapor deposition (PECVD), or the like, but embodiments are not limited thereto.

The second buffer film 122 may include the same material as the barrier layer 110 and may be formed at a deposition rate lower than a deposition rate of the barrier layer 110. For example, the deposition rate of the second buffer film 122 may be in a range of about 63 to about 66 Å/sec, in a range of about 60 to about 70 Å/sec, or about 64.6 Å/sec, but embodiments are not limited thereto.

In deposition conditions of the second buffer film 122, power may be in a range of about 7,000 to about 8,000 watt (W) or in a range of about 7,400 to about 7,600 W. In the deposition conditions of the second buffer film 122, spacing between a deposition source and a deposition substrate may be in a range of about 500 to about 700 mils or in a range of about 550 to about 650 mils. A deposition pressure of the second buffer film 122 may be in a range of about 800 to about 900 mTorr or in a range of about 830 to about 870 mTorr. Nitrous oxide ($N_2O$) may be provided in the deposition process of the second buffer film 122 in a range of about 50,000 to about 60,000 sccm (standard cubic centimeter per minute) or in a range of about 54,000 to about 55,000 sccm. Silane ($SiH_4$) may be provided in the deposition process of the second buffer film 122 in a range of about 2,000 to about 2,500 sccm or in a range of about 2,100 to about 2,300 sccm.

For example, in the deposition conditions of the second buffer film 122, the power may be about 7,520 W, the spacing between the deposition source and the deposition substrate may be about 600 mils, the deposition pressure of the second buffer film 122 may be about 850 mTorr, the provided nitrous oxide ($N_2O$) may be about 54,700 sccm, and the provided silane ($SiH_4$) may be about 2,200 sccm, but embodiments are not limited thereto.

As the deposition rate of the second buffer film 122 is set to be lower than the deposition rate of the barrier layer 110, the film density of the second buffer film 122 may be greater than the film density of the barrier layer 110, and the concentration of hydrogen (H) contained in the second buffer film 122 may be lower than the concentration of hydrogen (H) contained in the barrier layer 110.

In addition, after the buffer layer 120 is stacked, the surface of the second buffer film 122, which is the exposed top surface of the buffer layer 120, may be subjected to plasma treatment using a plasma of Ar gas. However, embodiments are not limited thereto. The plasma treatment may be performed using a plasma of any one of helium (He) gas or hydrogen (H2) gas. Accordingly, impurities adhered to the surface of the second buffer film 122 may be removed, and the amount of impurities remaining on the surface of the second buffer film 122 may be decreased. For example, fluorine (F) and the like may be adhered to the surface of the second buffer film 122, and may be removed through the plasma treatment, but embodiments are not limited thereto.

Therefore, the amount of fluorine (F) and the like remaining on the surface of the buffer layer 120 may decrease through the plasma treatment. Although the crystallization process (e.g., ELA process) of the semiconductor layer 130 is performed thereafter, the amount of fluorine (F) gas diffusing upward from the surface of the buffer layer 120 may decrease. For example, out-gassing occurring on the surface of the buffer layer 120 can be suppressed or prevented, and further, defects such as film breakage in the semiconductor layer 130 can be suppressed or prevented.

In addition, the buffer layer 120 may include argon (Ar) by the plasma treatment using argon (Ar). Argon (Ar) may be located in at least one region of the surface of the buffer layer 120 or the inside of the buffer layer 120. Argon (Ar) is an inert gas, and even if argon (Ar) is located in the buffer layer 120, it does not affect the insulating film properties of the buffer layer 120, and may not affect the electrical properties of the semiconductor layer 130 thereabove.

Figure 16:
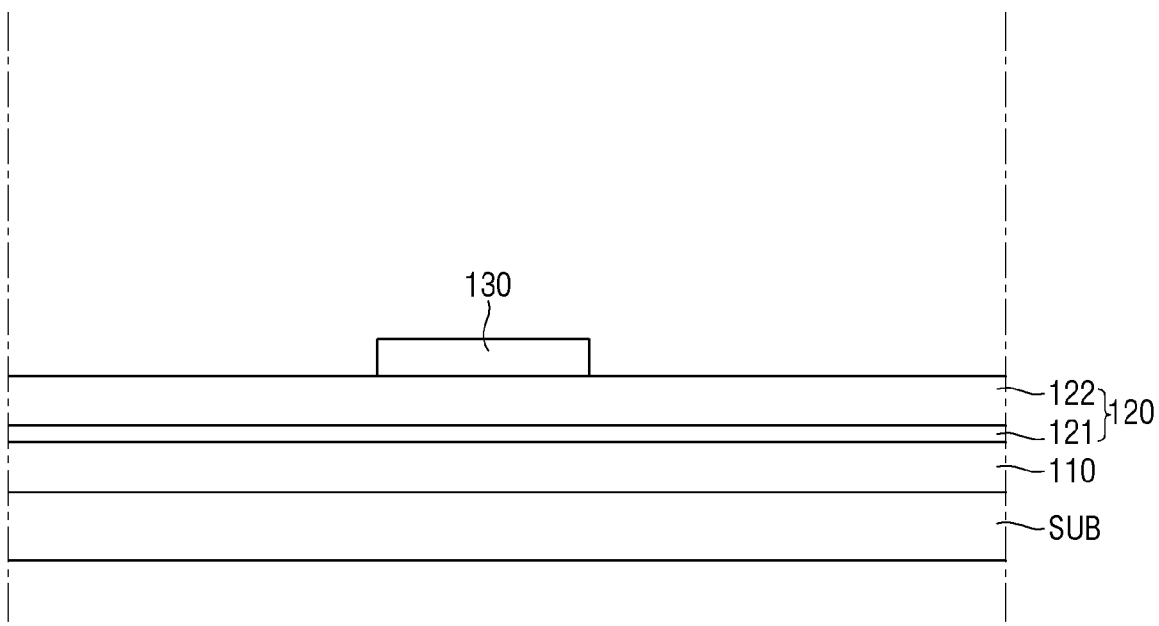

Subsequently, referring to FIG. 16, the semiconductor layer 130 is formed on the buffer layer 120. The semiconductor layer 130 may be disposed only on a partial region of the buffer layer 120. After a semiconductor layer material is entirely deposited on the buffer layer 120, the semiconductor layer material may be patterned through a photolithography process to form the semiconductor layer 130 as illustrated in FIG. 16.

Thereafter, the first gate conductive layer 140 (see FIG. 4), the second gate conductive layer 150 (see FIG. 4), the data conductive layer 160 (see FIG. 4), the pixel defining layer PDL (see FIG. 4), the light emitting layer EML (see FIG. 4), the cathode electrode CAT (see FIG. 4), and the like may be sequentially formed. Methods of forming the above-described components are widely known in the art, and a description thereof will be omitted in the descriptions for descriptive convenience.

Hereinafter, other embodiments will be described. In the following embodiments, a description of the same components as those of the above-described embodiment will be omitted or simplified to avoid redundancy, and differences will be mainly described.

Figure 17:
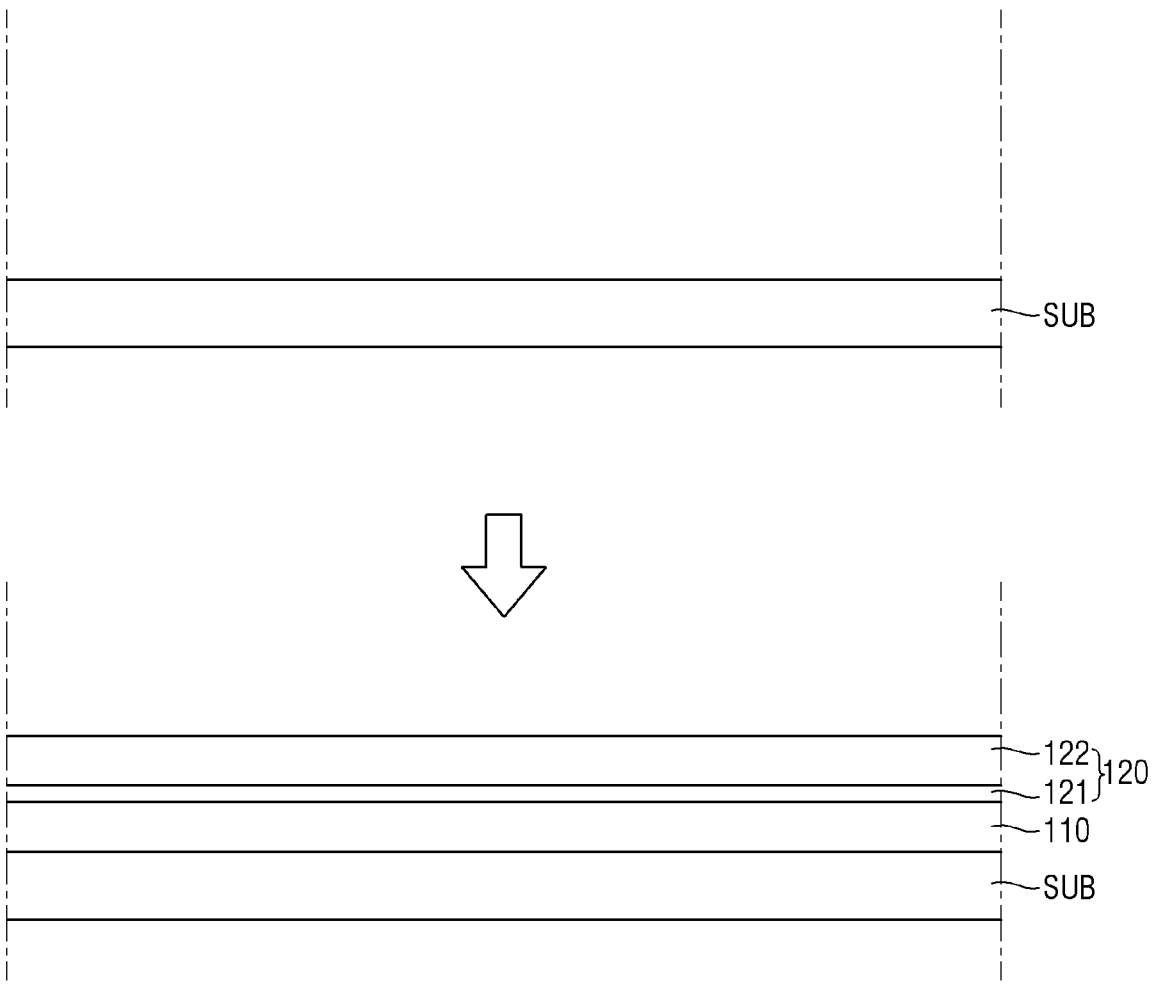
FIG. 17 shows cross-sectional views illustrating another embodiment of the method of fabricating the display device of FIG. 1.

FIG. 17 shows cross-sectional views illustrating a method of fabricating a display device according to another embodiment.

Referring to FIG. 17, the method of fabricating the display device according to the present embodiment is different from the embodiment of FIGS. 12 to 16 in that the barrier layer 110 and the buffer layer 120 are formed through successive film formation.

Specifically, in the method of fabricating the display device according to the embodiment, the barrier layer 110 and the buffer layer 120 may be successively formed. After the barrier layer 110 is stacked on the base substrate SUB, the first buffer film 121 may be successively stacked on the barrier layer 110. After the first buffer film 121 is stacked, the second buffer film 122 may be successively stacked on the first buffer film 121. For example, the barrier layer 110 and the buffer layer 120 may be formed in the same vacuum chamber. Accordingly, the amount of impurities, which may be adhered to the surface of the barrier layer 110 stacked on the base substrate SUB, may decrease.

Therefore, even in this case, out-gassing that may occur on the surface of the barrier layer 110 may be suppressed or prevented, thereby suppressing or preventing defects such as film breakage in the semiconductor layer 130 (see FIG. 4).

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a substrate; and
a semiconductor layer disposed on the substrate, and comprising a first area, a second area, and a third area that are sequentially positioned by dividing the semiconductor layer into three areas in a thickness direction of the semiconductor layer,
wherein the semiconductor layer comprises polycrystalline silicon,
a concentration of fluorine contained in the semiconductor layer has a first peak value in the first area and a second peak value in the third area, and
the first peak value of the concentration of the fluorine in the semiconductor layer is about 30% or less of the second peak value of the concentration of the fluorine in the semiconductor layer.

2. The display device of claim 1, wherein the semiconductor layer further comprises a low point value as a lowest value of the concentration of the fluorine in the semiconductor layer, and
the low point value of the concentration of the fluorine is substantially equal to or less than the first peak value of the concentration of the fluorine.

3. The display device of claim 2, wherein the low point value of the concentration of the fluorine is substantially equal to or less than 1E20 atoms/cm$^3$.

4. The display device of claim 3, wherein the low point value of the concentration of the fluorine is in the second area.

5. The display device of claim 1, wherein the semiconductor layer further comprises a first surface facing the substrate and a second surface opposite to the first surface,
wherein the first surface is disposed in the first area, and the second surface is disposed in the third area, and
wherein the first peak value is disposed on the first surface, and the second peak value is disposed on the second surface in the thickness direction.

6. The display device of claim 1, further comprising:
a barrier layer disposed on the substrate; and
a buffer layer disposed on the barrier layer, and comprising a first buffer film and a second buffer film sequentially stacked,
wherein the barrier layer and the second buffer film comprise silicon oxide, and the first buffer film comprises silicon nitride.

7. The display device of claim 6, wherein a film density of the second buffer film is greater than a film density of the barrier layer.

8. The display device of claim 7, wherein the film density of the second buffer film is in a range of about 2.2 g/cm$^3$ to about 2.25 g/cm$^3$.

9. The display device of claim 6, wherein a concentration of hydrogen of the second buffer film is lower than a concentration of hydrogen of the barrier layer.

10. The display device of claim 9, wherein the concentration of hydrogen of the second buffer film is about 5 at % or less.

11. The display device of claim 6, wherein the first buffer film comprises a third surface facing the barrier layer and a fourth surface opposite to the third surface,
a concentration of fluorine contained in the first buffer film has a third peak value on at least one of the third surface and the fourth surface, and
the third peak value of the concentration of the fluorine in the first buffer film is higher than a concentration of fluorine at a center point of the first buffer film in the thickness direction.

12. The display device of claim 11, wherein the third peak value of the concentration of the fluorine in the first buffer film is about 2.5 times or less the concentration of the fluorine at the center point of the first buffer film.

13. The display device of claim 12, wherein a concentration of carbon contained in the first buffer film has a fourth peak value on at least one of the third surface and the fourth surface, and
the fourth peak value of the concentration of the carbon in the first buffer film is about 2.5 times or less a concentration of carbon at the center point of the first buffer film.

* * * * *